(12) United States Patent
Kimura

(10) Patent No.: US 6,850,109 B2
(45) Date of Patent: Feb. 1, 2005

(54) LINEAR VOLTAGE SUBTRACTOR/ADDER CIRCUIT AND MOS DIFFERENTIAL AMPLIFIER CIRCUIT THEREFOR

(75) Inventor: Katsuji Kimura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/940,472

(22) Filed: Aug. 29, 2001

(65) Prior Publication Data

US 2002/0060598 A1 May 23, 2002

(30) Foreign Application Priority Data

Aug. 30, 2000 (JP) ........................................ 2000-260806

(51) Int. Cl.[7] .............................................. G06F 7/42
(52) U.S. Cl. ........................ 327/361; 327/563; 330/253
(58) Field of Search .............................. 327/52, 55, 56, 327/63, 65, 70, 90, 352, 355, 359, 361, 427, 432, 434, 437, 562, 563; 330/252, 261, 258, 253

(56) References Cited

U.S. PATENT DOCUMENTS

| | | | | |
|---|---|---|---|---|
| 5,381,113 A | * | 1/1995 | Kimura | ........................ 330/253 |
| 5,594,383 A | * | 1/1997 | Tamba | ......................... 327/552 |
| 5,602,509 A | * | 2/1997 | Kimura | ........................ 330/253 |

FOREIGN PATENT DOCUMENTS

| | | |
|---|---|---|
| JP | 07-127887 | 5/1995 |
| JP | 2556293 | 9/1996 |

OTHER PUBLICATIONS

R. R. Torrance et al., "CMOS Voltage to Current Transducers", *IEEE Transactions on Circuits and Systems*, vol. CAS–32, No. 11, Nov. 1985, pp. 1097–1104.

K. Kimura, "MOS Linear and Square–Law Transconductance Amplifiers Consisting of a Source–Coupled Pair with Load Transistors and a Quandritail Cell Using Only N–Channel MOS Unit Transistors", *Technical Report of IEICE*, CAS98–41, NLP98–49, Jul. 1998, pp. 17–24.

* cited by examiner

*Primary Examiner*—Minh Nguyen
(74) *Attorney, Agent, or Firm*—Sughrue Mion, PLLC

(57) ABSTRACT

A voltage subtractor/adder circuit has a differential pair having first and second MOS transistors. Gate electrodes of the first and second MOS transistors form input terminals for receiving an input differential voltage. Drain electrodes of the first and second MOS transistors form output terminals for outputting a subtraction output signal. Source electrodes of the first and second MOS transistors are commonly coupled to form an output terminal for addition output voltage. The sum of currents flowing through the first and second MOS transistors increases in proportion to the square of the input differential voltage. It is also possible to drive the differential pair by a constant current source. A level shifter may be provided for level-shifting the addition output voltage from the commonly coupled source electrodes.

2 Claims, 16 Drawing Sheets

LINEAR VOLTAGE SUBTRACTOR/ADDER CIRCUIT AND MOS DIFFERENTIAL AMPLIFIER CIRCUIT THEREFOR

FIELD OF THE INVENTION

The present invention relates generally to a MOS differential amplifier circuit, and more particularly to a voltage subtractor/adder circuit formed on a semiconductor integrated circuit device and a MOS differential amplifier circuit which realizes such voltage subtractor/adder circuit and which has linear transconductance.

BACKGROUND OF THE INVENTION

FIG. 17 shows a conventional voltage subtractor/adder circuit described in a publication (IEEE Journal of Solid-State Circuits, Vol. CAS-32, No. 11, pp. 1097–1104, November 1985). The circuit of FIG. 17 comprises two sets of MOS differential pairs. One of the MOS differential pairs comprises MOS transistors M1 and M2, and the other of the MOS differential pairs comprises MOS transistors M3 and M4. Each of the MOS differential pairs is driven by a tail current Iss.

In the voltage subtractor/adder circuit shown in FIG. 17, voltages V1 and V2 are applied to the gates of the transistors M1 and M4, respectively, of the two sets of MOS differential pairs. Both the transistors M2 and M3 are diode-coupled and are driven by a common constant current source (Iss).

Here, with respect to the two sets of MOS differential pairs, tail current values of respective MOS differential pairs and a current value of a constant current source which drives the diode-coupled transistors M2 and M3 are all the same. Therefore, the following formulas are obtained.

$$I_{D1}+I_{D2}=Iss \quad (1)$$

$$I_{D3}+I_{D4}=Iss \quad (2)$$

$$I_{D2}+I_{D3}=Iss \quad (3)$$

where, $I_{D1}$, $I_{D2}$, $I_{D3}$ and $I_{D4}$ designates drain currents of the transistors M1, M2, M3 and M4, respectively. Therefore, the following relations are also obtained.

$$I_{D1}=I_{D3} \quad (4)$$

$$I_{D2}=I_{D4} \quad (5)$$

That is, since the currents flowing through the transistors M1 and M2 are equal to the currents flowing through the transistors M3 and M4, respectively, the differential input voltages of the two sets of MOS differential pairs become equal to each other. Therefore, assuming that a common gate potential of the diode-coupled transistors M2 and M3 is $V_0$, the following relation exists.

$$V_1-V_0=V_0-V_2 \quad (6)$$

That is, the following formula is obtained.

$$V_0 = \frac{V_1+V_2}{2} \quad (7)$$

From this formula, it can be seen that the circuit shown in FIG. 17 functions as a voltage adder circuit. In this case, the differential input voltage of each of the MOS differential pairs becomes as follows:

$$V_1 - V_0 = V_0 - V_2 = \frac{V_1-V_2}{2} \quad (8)$$

Next, drain currents $I_{D1}$ and $I_{D4}$ of the transistors M1 and M4, respectively, of the MOS differential pairs will be derived.

Neglecting the body effect and the channel length modulation, and assuming that the relationship between a drain current and a gate-source voltage of a MOS transistor operating in saturation region follows the square-law, the drain current of a MOS transistor can be represented as follows:

$$I_D=\beta(V_{GS}-V_{TH})^2 \ (V_{GS} \geq V_{TH}) \quad (9a)$$

$$I_D=0 \ (V_{GS} \leq V_{TH}) \quad (9b)$$

Here, $\beta=\mu(C_{OX}/2)(W/L)$ is a transconductance parameter, $\mu$ is an effective mobility of carrier, $C_{OX}$ is capacitance of a gate oxide film per unit area, W is a gate width, L is a gate length, and $V_{TH}$ is the threshold voltage of a MOS transistor.

Assuming that the MOS transistors are matched well, the drain currents of the transistors M1 and M4 become as follows:

$$\begin{cases} I_{D4} = \frac{1}{2}\left\{Iss + \beta\frac{V_i}{2}\sqrt{\frac{2Iss}{\beta}-\frac{V_i^2}{4}}\right\}\left(|V_i| \leq 2\sqrt{\frac{Iss}{\beta}}\right) & (10a) \\ I_{D4} = \frac{1}{2}Iss\cdot sgn(V_i)\left(|V_i| \geq 2\sqrt{\frac{Iss}{\beta}}\right) & (10b) \end{cases}$$

$$\begin{cases} I_{D1} = \frac{1}{2}\left\{Iss + \beta\frac{V_i}{2}\sqrt{\frac{2Iss}{\beta}-\frac{V_i^2}{4}}\right\}\left(|V_i| \leq 2\sqrt{\frac{Iss}{\beta}}\right) & (11a) \\ I_{D1} = \frac{1}{2}Iss\cdot sgn(V_i)\left(|V_i| \geq 2\sqrt{\frac{Iss}{\beta}}\right) & (11b) \end{cases}$$

where, $$Vi=V_1-V_2 \quad (12)$$

Therefore, the circuit shown in FIG. 17 also functions as a voltage subtractor circuit. That is, the circuit shown in FIG. 17 is a voltage subtractor/adder circuit.

An explanation will now be made on a MOS differential amplifier circuit which has linear transconductance. FIG. 18 shows a general structure of this type of MOS differential amplifier circuit which is disclosed in Japanese patent laid-open publication No. 7-127887. The circuit of FIG. 18 comprises a MOS differential pair having MOS transistors M1 and M2 which are driven by a tail current Iss (=$I_0$+$\beta Vi^2/2$).

Assuming that the MOS transistors are matched well, a differential output current $\Delta I^D=I_{D1}-I_{D2}$ of the MOS differential pair comprising the transistors M1 and M2 becomes as follows:

$$\begin{cases} \Delta I_D = \beta V_i \sqrt{\dfrac{2I_{SS}}{\beta} - V_i^2} & \left(|V_i| \leq \sqrt{\dfrac{I_{SS}}{\beta}}\right) \quad (13a) \\ \Delta I_D = I_{SS}\,sgn(V_i) & \left(|V_i| \geq \sqrt{\dfrac{I_{SS}}{\beta}}\right) \quad (13b) \end{cases}$$

Therefore, when the value within √ in the formula (13a) is a constant value, the differential output current $\Delta I_D$ of the MOS differential pair becomes linear. That is, the condition of the tail current in an adaptive-biasing differential pair becomes as follows:

$$I_{SS} = I_0 + \frac{1}{2}\beta V_i^2 \quad (14)$$

Therefore, by driving a MOS differential pair by using a tail current which has a square-law characteristic of an input voltage, it is possible to completely compensate transconductance of the MOS differential pair. The method of driving a MOS differential pair by using a current which varies dynamically such that the transconductance becomes linear is called an adaptive-biasing method. Also, the differential pair which has a linear transconductance obtained in this way is called an adaptive-biasing differential pair.

FIG. 19 shows an example of a concrete circuit of an adaptive-biasing differential pair in which a tail current is supplied thereto by using quadri-tail cell as a squaring circuit.

An output current $I_L$ of an output of the quadri-tail cell shown in FIG. 19 can be obtained as follows:

$$I_L = I_{D3} + I_{D4} \quad (15)$$

$$\begin{cases} I_L = \dfrac{I_0}{4} - \dfrac{\beta V_i^2}{4} & \left(|V_i| \leq \sqrt{\dfrac{2I_0}{3\beta}}\right) \quad (15a) \\ I_L = \dfrac{2}{3} I_0 - \dfrac{\beta V_i^2 + 2\beta|V_i|\sqrt{2\left(\dfrac{6I_0}{\beta} - V_i^2\right)}}{18} & \left(\sqrt{\dfrac{2I_0}{3\beta}} \leq |V_i| \leq 2\sqrt{\dfrac{I_0}{\beta}}\right) \quad (15b) \\ I_L = 0 & \left(|V_i| \geq 2\sqrt{\dfrac{I_0}{\beta}}\right) \quad (15c) \end{cases}$$

Therefore, it is possible to obtain a square-law current.

In order to adaptively bias a MOS differential pair by driving the MOS differential pair by using the output current of the quadri-tail cell, it is possible to set the tail current as determined by the following formula:

$$I_{SS} = 2I_0 - 2I_L \quad (16)$$

By setting the tail current in accordance with the above formula, transconductance becomes a constant value $g_m = \sqrt{(2I_0)/\beta}$, in a range of an input voltage $|V_i| \leq \sqrt{(2I_0)/(3\beta)}$.

A differential output current $\Delta I$ ($=I_{D1}-I_{D2}$) of an adaptive-biasing differential pair which uses the quadri-tail cell becomes as follows:

$$\begin{cases} \Delta I = \sqrt{\dfrac{2I_0}{\beta}}\, V_i & \left(|V_i| \leq \sqrt{\dfrac{2I_0}{3\beta}}\right) \quad (17a) \\ \Delta I = \dfrac{\beta V_i}{3}\sqrt{12\dfrac{I_0}{\beta} - 7V_i^2 + 4|V_i|\sqrt{2\left(\dfrac{6I_0}{\beta} - V_i^2\right)}} & \left(\sqrt{\dfrac{2I_0}{3\beta}} \leq |V_i| \leq \sqrt{\left(1+\dfrac{1}{\sqrt{2}}\right)\dfrac{I_0}{\beta}}\right) \quad (17b) \\ \Delta I = \dfrac{\beta V_i^2 + 6I_0 + 2\beta|V_i|\sqrt{2\left(\dfrac{6I_0}{\beta} - V_i^2\right)}}{9} & \left(\sqrt{\left(1+\dfrac{1}{\sqrt{2}}\right)\dfrac{I_0}{\beta}} \leq |V_i| \leq 2\sqrt{\dfrac{I_0}{\beta}}\right) \quad (17c) \\ \Delta I = 2I_0\,sgn(V_i) & \left(|V_i| \geq \sqrt{\dfrac{I_0}{\beta}}\right) \quad (17d) \end{cases}$$

Transconductance can be obtained by differentiating the formulas (17a) through (17d) by an input voltage Vi.

$$\begin{cases} \dfrac{d(\Delta I)}{dV_i} = \sqrt{\dfrac{2I_0}{\beta}} & \left(|V_i| \leq \sqrt{\dfrac{2I_0}{3\beta}}\right) \quad (18a) \\ \dfrac{d(\Delta I)}{dV_i} = \dfrac{\beta}{3}\sqrt{12\dfrac{I_0}{\beta} - 7V_i^2 + 4|V_i|\sqrt{2\left(\dfrac{6I_0}{\beta} - V_i^2\right)}} \\ \quad + \dfrac{\dfrac{\beta}{3}V_i\left\{-7V_i + 2sgn(V_i)\sqrt{2\left(\dfrac{6I_0}{\beta} - V_i^2\right)} - \dfrac{4\beta|V_i|V_i}{\sqrt{2\left(\dfrac{6I_0}{\beta} - V_i^2\right)}}\right\}}{\sqrt{\dfrac{12I_0}{\beta} - 7V_i^2 + 4|V_i|\sqrt{2\left(\dfrac{6I_0}{\beta} - V_i^2\right)}}} \\ & \left(\sqrt{\dfrac{2I_0}{3\beta}} \leq |V_i| \leq \sqrt{\left(1+\dfrac{1}{\sqrt{2}}\right)\dfrac{I_0}{\beta}}\right) \quad (18b) \\ \dfrac{d(\Delta I)}{dV_i} = \dfrac{2\beta}{9}\left\{V_i + sgn(V_i)\sqrt{2\left(\dfrac{6I_0}{\beta} - V_i^2\right)} - \dfrac{4\beta|V_i|V_i}{\sqrt{2\left(\dfrac{6I_0}{\beta} - V_i^2\right)}}\right\} \\ & \left(\sqrt{\left(1+\dfrac{1}{\sqrt{2}}\right)\dfrac{I_0}{\beta}} \leq |V_i| \leq \sqrt{\dfrac{I_0}{\beta}}\right) \quad (18c) \\ \dfrac{d(\Delta I)}{dV_i} = 0 & \left(|V_i| \geq 2\sqrt{\dfrac{I_0}{\beta}}\right) \quad (18d) \end{cases}$$

As can be seen from the above formulas, the transconductance of an adaptive-biasing differential pair becomes a constant value $g_m = \sqrt{(2I_0)/\beta}$, that is, the transconductance of an adaptive-biasing differential pair shows a flat characteristic, in a range of an input voltage $|V_i| \leq \sqrt{(2I_0)/(3\beta)}$.

Although the above-mentioned voltage adder circuit has both the subtraction function and addition function, the subtraction function is inferior in linearity to the addition function.

Also, in a linear transconductance amplifier for realizing both the subtraction function and addition function, an input voltage range in which the linear transconductance amplifier operates linearly depends on an input voltage range within which the squaring circuit for supplying the tail current has a square-law characteristic. However, it is difficult to realize a squaring circuit which has an input voltage range within which the squaring circuit shows a square-law characteristic throughout the whole operating input voltage range of the MOS differential pair. Therefore, conventionally, it was impossible to realize a linear transconductance amplifier having a wide linear input voltage range.

In the field of analog signal processing, a circuit for performing subtraction and/or addition is an essential function block. Especially, the requirement for realizing a MOS differential amplifier circuit having linear subtraction and addition function has become stronger.

Also, such MOS differential amplifier circuit having linear subtraction and addition function can be realized by using a differential amplifier circuit having linear transconductance. Therefore, such differential amplifier circuit having linear transconductance is also an essential function block in the field of analog signal processing. Especially, the requirement for realizing a MOS differential amplifier circuit having linear transconductance has become stronger.

SUMMARY OF THE INVENTION

Therefore, it is an object of the present invention to provide a MOS differential amplifier circuit which has linear subtraction and addition function over a wide input voltage range.

It is another object of the present invention to provide a MOS differential amplifier circuit which has linear subtraction and addition function and which is easily implemented in an LSI device.

It is still another object of the present invention to provide a MOS differential amplifier circuit which has subtraction and addition function and which has simple circuit structure.

It is still another object of the present invention to provide a MOS differential amplifier circuit which has linear transconductance over a wide input voltage range.

It is still another object of the present invention to provide a MOS differential amplifier circuit which has linear transconductance and which is easily implemented in an LSI device.

It is still another object of the present invention to obviate the disadvantages of the conventional MOS differential amplifier circuits.

According to an aspect of the present invention, there is provided a voltage subtractor/adder circuit comprising: a differential pair having first and second MOS transistors, gate electrodes of said first and second MOS transistors forming input terminals for receiving an input differential voltage, drain electrodes of said first and second MOS transistors forming output terminals for outputting a subtraction output signal, and source electrodes of said first and second MOS transistors being commonly coupled to form an output terminal for addition output voltage; and wherein the sum of currents flowing through said first and second MOS transistors increases in proportion to the square of said input differential voltage.

In this case, it is preferable that the voltage subtractor/adder circuit further comprises a level shifter for level-shifting the addition output voltage from the source electrodes which are commonly coupled.

According to another aspect of the present invention, there is provided a voltage subtractor/adder circuit comprising: a differential pair having first and second MOS transistors, gate electrodes of the first and second MOS transistors forming input terminals for receiving an input differential voltage, drain electrodes of the first and second MOS transistors forming output terminals for outputting a subtraction output signal, and source electrodes of the first and second MOS transistors being commonly coupled to form an output terminal for addition output voltage; and a constant current source which drives the differential pair.

In this case, it is preferable that the voltage subtractor/adder circuit further comprises a level shifter for level-shifting the addition output voltage from the source electrodes which are commonly coupled.

According to still another aspect of the present invention, there is provided a MOS differential amplifier circuit comprising: a MOS differential pair having first and second MOS transistors and receiving an input differential voltage, source electrodes of the first and second MOS transistors being commonly coupled and being driven by a current source; and wherein current value of the current source being controlled such that a difference voltage between a common mode voltage and a common source voltage of the first and second MOS transistors becomes a constant value.

In this case, it is also preferable that the MOS differential amplifier circuit further comprises a level shifter for level-shifting the common source volage of the first and second MOS transistors.

According to still another aspect of the present invention, there is provided a MOS differential amplifier circuit comprising: a MOS differential pair having first and second MOS transistors and receiving an input differential voltage, source electrodes of the first and second MOS transistors being commonly coupled and being driven by a constant current source; and wherein a current is injected into the constant current source such that a difference voltage between a common mode voltage and a common source voltage of the first and second MOS transistors becomes a constant voltage.

According to still another aspect of the present invention, there is provided a MOS differential amplifier circuit comprising: a MOS differential pair having first and second MOS transistors and receiving an input differential voltage, source electrodes of the first and second MOS transistors being commonly coupled and being driven by a constant current source; and third and fourth MOS transistors which are load transistors of the first and second MOS transistors, respectively, and whose gates receive the sum of a predetermined constant voltage and a voltage obtained by subtracting a common source voltage of the first and second MOS transistors from a common mode voltage.

According to still another aspect of the present invention, there is provided a complementary MOS differential amplifier circuit comprising: a MOS differential pair having first and second MOS transistors and receiving an input differential voltage, source electrodes of the first and second MOS transistors being commonly coupled and being driven by a first constant current source; a MOS quadri-tail cell having third, fourth, fifth and sixth MOS transistors which have different conductivity type from that of the first and second MOS transistors, source electrodes of the third, fourth, fifth and sixth MOS transistors being commonly coupled and being driven by a second constant current source; wherein gate electrodes of the fifth and sixth MOS transistors being coupled to a common source electrode of the first and second MOS transistors, drain electrodes of the fifth and third MOS transistors being commonly coupled and forming one output terminal, drain electrodes of the sixth and fourth MOS transistors being commonly coupled and forming the other output terminal, and gate electrodes of the first and second MOS transistors and gate electrodes of the third and fourth MOS transistors receiving input voltages.

In this case, it is preferable that the complementary MOS differential amplifier circuit further comprises level shifters for level-shifting the input voltages before being applied to the gate electrodes of the first and second MOS transistors and the gate electrodes of the third and fourth MOS transistors.

It is also preferable that the ratio of the current value of the first constant current source and transconductance parameter of the first and second MOS transistors is approximately half of the ratio of the current value of the second constant current source and transconductance parameter of the third, foruth, fifth and sixth MOS transistors.

It is further preferable that the complementary MOS differential amplifier circuit comprises first and second MOS differential amplifier circuits each of which is the complementary MOS differential amplifier circuit as set forth above, wherein corresponding MOS transistors of the first and second MOS differential amplifier circuits have mutually different conductivity types and wherein the first and second MOS differential amplifier circuits are coupled parallel to form a differential input pair.

It is also advantageous that transconductance of the MOS differential amplifier circuit is adjustable by controlling current values of at least one of the first and second constant current sources.

Constitution of the present invention is again described briefly in other words. The linear voltage subtractor/adder circuit according to the present invention has a structure in which gate electrodes of first and second transistors constitute a pair of input terminals or an input terminal pair, and drains of the first and second transistors constitute a pair of subtraction output terminals or a subtraction output terminal pair. Source electrodes of the first and second transistors are commonly coupled and constitute an addition output terminal. The sum of currents flowing through the first and second transistors increases in proportion to a differential input voltage.

Also, a simplified voltage subtractor/adder circuit according to the present invention has a structure in which gate electrodes of first and second transistors constitute a pair of input terminals or an input terminal pair, and drains of the first and second transistors constitute a pair of subtraction output terminals or a subtraction output terminal pair. Source electrodes of the first and second transistors are commonly coupled to constitute an addition output terminal and are driven by a constant current source.

In a CMOS differential amplifier circuit having linear transconductance according to the present invention, an input pair is composed of a MOS differential pair in which source electrodes of first and second transistors are commonly coupled and are driven by a current source. The current value of the current source is controlled such that a difference voltage between the common mode voltage and the common source voltage of the first and second transistors becomes a constant voltage.

In other constitution, an input pair is composed of a MOS differential pair in which source electrodes of first and second transistors are commonly coupled and are driven by a constant current source, and a current is sourced into the constant current source such that a difference voltage between the common mode voltage and the common source voltage of the first and second transistors becomes a constant voltage.

Further, a MOS differential amplifier circuit having linear transconductance according to the present invention comprises a MOS differential pair and a MOS quadri-tail cell coupled parallel with the MOS differential pair. Transistors constituting the MOS differential pair have different conductivity type from that of transistors constituting the MOS quadri-tail cell.

Operation of the present invention will now be described. Non-linearity of a MOS differential pair is caused by an increase in the common source voltage according to an increase in an input voltage. Therefore, in the MOS differential pair, it is possible to obtain a drive current which is proportional to the square of an input voltage, by controlling a tail current such that the difference between the common source voltage and the input common mode voltage becomes constant. Thereby, the tail current driving the MOS differential pair becomes a current which is proportional to the square of an input voltage. Thus, it is possible to equivalently obtain an adaptive-biasing differential pair and to realize a CMOS differential amplifier circuit having linear transconductance. By such structure of the present invention, the difference between the common source voltage and the input common mode voltage becomes constant, so that a voltage addition function can be obtained. Also, the differential output current is proportional to the differential input voltage, so that a voltage subtraction function can be obtained. As a result thereof, it is possible to realize a linear voltage subtractor/adder circuit.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

Figure 1:
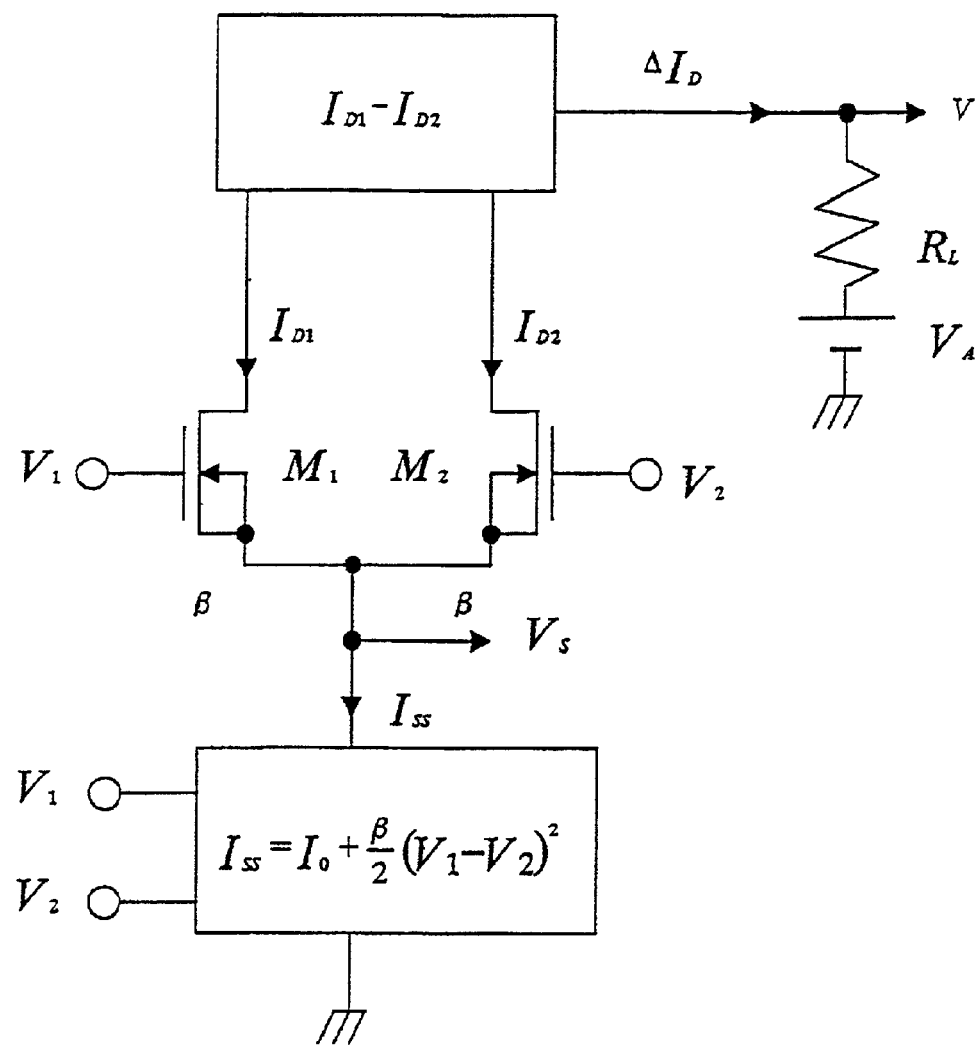
FIG. 1 is a circuit diagram showing a general structure of a voltage subtractor/adder circuit according to an embodiment of the present invention.

FIG. 1 is a circuit diagram showing a general structure of a voltage subtractor/adder circuit having linear subtraction and addition function according to the present invention.

The circuit of FIG. 1 has a MOS differential pair which comprises transistors M1 and M2 driven by a tail current Iss $(=I_0 + \beta V_i^2/2)$. Assuming the transistors M1 and M2 are well matched with each other, the differential output current $\Delta I_D$ $(=I_{D1} - I_{D2})$ of the MOS differential pair comprising the transistors M1 and M2 is represented as follows:

$$\begin{cases} \Delta I_D = \beta V_i \sqrt{\dfrac{2I_{SS}}{\beta} - V_i^2} & \left(|V_i| \leq \sqrt{\dfrac{I_{SS}}{\beta}}\right) & (19a) \\ \Delta I_D = I_{SS} \cdot sgn(V_i) & \left(|V_i| \geq \sqrt{\dfrac{I_{SS}}{\beta}}\right) & (19b) \end{cases}$$

Therefore, the condition the differential output current $\Delta I_D$ of the MOS differential pair becomes linear is that the value within √in the formula (19a) is a constant value. That is, in order for the MOS differential pair to become an adaptive-biasing differential pair, the condition of the tail current should be as follows:

$$I_{SS} = I_0 + \frac{1}{2}\beta V_i^2 \left(|V_i| \leq \sqrt{\frac{2I_0}{\beta}}\right) \tag{20}$$

The above formula (20) differs from the formula (14) in that, in the formula (20), an input voltage range is limited within the specified range. However, when the transconductance of the MOS differential pair is to be compensated, it is natural that such compensation is not effective outside the operational input voltage range of the MOS differential pair.

Therefore, it is possible to completely compensate the transconductance of the MOS differential pair by driving the MOS differential pair with a tail current having a square-law characteristic of an input voltage. In this case, the differential output current $\Delta I_D$ $(=I_{D1} - I_{D2})$ is obtained as follows:

$$\Delta I_D = \sqrt{2\beta I_0} V_i \left(|V_i| \leq \sqrt{\frac{2I_0}{\beta}}\right) \tag{21}$$

Therefore, by converting the differential output current $\Delta I_D$ into a corresponding voltage, it is possible to obtain a linear subtraction output.

On the other hand, the common source voltage Vs can be obtained by solving the following formulas.

$$I_{D1} = \beta\left(\frac{V_1 + V_2}{2} + \frac{V_i}{2} - V_S - V_{TH}\right)^2 \tag{22}$$

$$I_{D2} = \beta\left(\frac{V_1 + V_2}{2} - \frac{V_i}{2} - V_S - V_{TH}\right)^2 \tag{23}$$

$$I_{D1} + I_{D2} = I_{SS} = I_0 + \frac{1}{2}\beta V_i^2 \tag{24}$$

By solving the formulas (22) through (24), it is possible to obtain the following formula.

$$V_S = \frac{V_1 + V_2}{2} - \sqrt{\frac{I_0}{2\beta}} - V_{TH} \tag{25}$$

This is equivalent to the notation: $V_s = (V_1+V_2)/2 - \sqrt{[I_0/(2\beta)]} - V_{TH}$, and shows that the common source voltage Vs includes a constant offset voltage:

$$-\sqrt{[I_0/(2\beta)]} - V_{TH}.$$

This formula shows that, from the common source voltage Vs, it is possible to obtain an addition voltage of input signals.

The common source voltage Vs includes a constant offset voltage $-\sqrt{(I_0/\beta)} - V_{TH}$. Therefore, as shown in FIG. 2, it is possible to remove the offset voltage by level-shifting the common source voltage Vs to obtain an addition voltage $(V_1+V_2)/2$.

Figure 2:
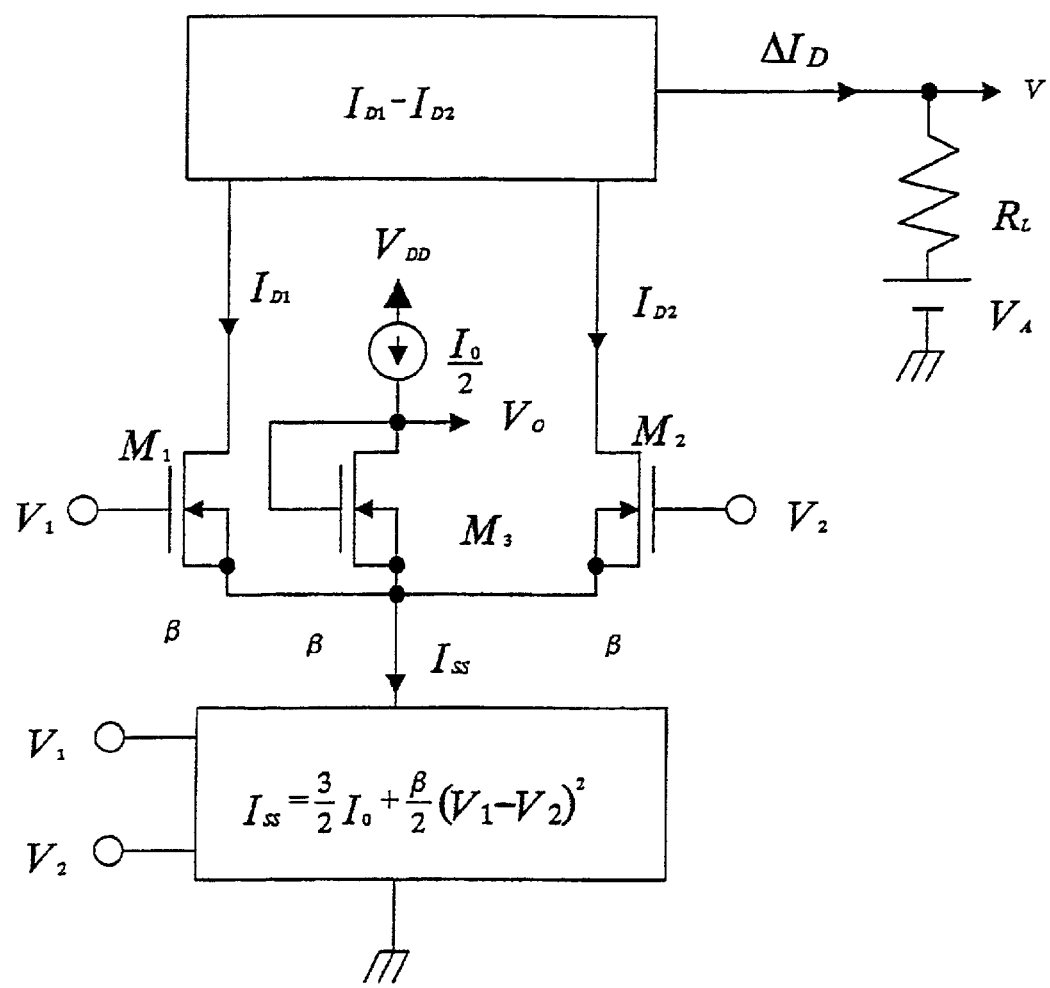
FIG. 2 is a circuit diagram showing a general structure of a voltage subtractor/adder circuit, which includes a level shifter, according to another embodiment of the present invention.
Figure 3:
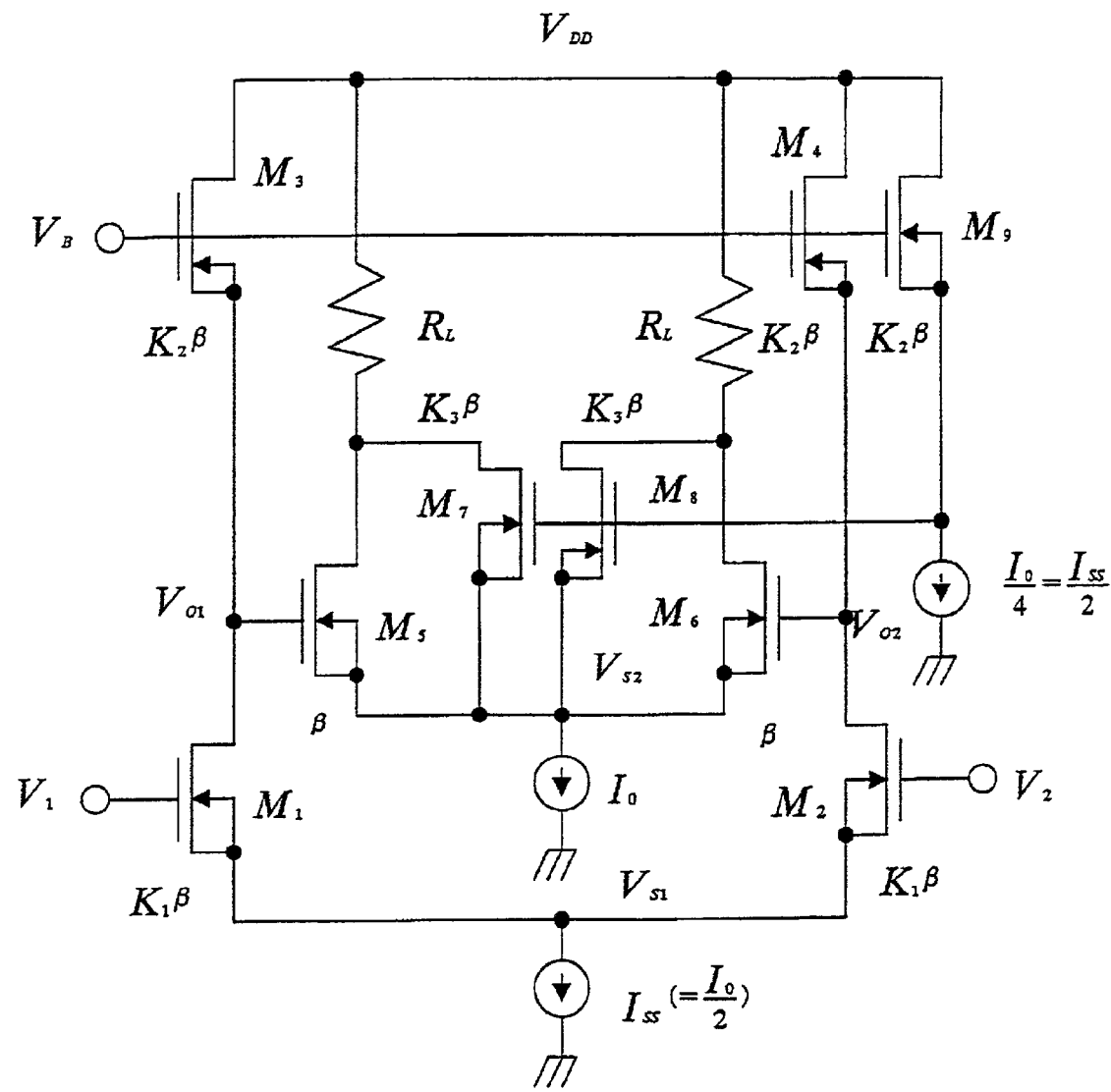
FIG. 3 is a circuit diagram showing a structure of a voltage subtractor/adder circuit according to still another embodiment of the present invention.

FIG. 3 is a circuit diagram showing an example of a practical circuit for realizing a voltage subtraction and addition circuit shown in FIG. 2.

The circuit of FIG. 3 has a MOS differential pair which comprises transistors M1 and M2 each having a transistor size ratio (that is, gate width W/gate length L) with respect to a unit transistor is $K_1$ and which is driven by a constant current Iss $(=I_0/2)$. The circuit of FIG. 3 also has a triple-tail cell in which source electrodes of unit transistors M5 and M6 and of a transistor M7 having a transistor size ratio $K_3$ with respect to a unit transistor are commonly coupled and which is driven by a constant current $I_0$. The circuit of FIG. 3 further has a transistor M8 for supplying a bias voltage of the transistor M7, and a constant current source Iss/2 $(=I_0/4)$ for driving the transistor M8. From the circuit analysis described below, it is possible to obtain a relation Iss=$I_0$/2. Also, the transistor M7 can be divided into two pieces and can be represented as M7A and M7B.

Assuming that the transistors are well matched, output currents of the MOS differential pair comprising the transistors M1 and M2 each of which has a transistor size ratio of $K_1$ with respect to a unit transistor are represented as follows:

$$I_{D1} = \frac{1}{2}\left\{I_0 + K_1\beta V_i\sqrt{\frac{2I_{SS}}{K_1\beta} - V_i^2}\right\}\left(|V_i| \le \sqrt{\frac{I_{SS}}{K_1\beta}}\right) \quad (26a)$$

$$I_{D2} = \frac{1}{2}\left\{I_0 - K_1\beta V_i\sqrt{\frac{2I_{SS}}{K_1\beta} - V_i^2}\right\}\left(|V_i| \le \sqrt{\frac{I_{SS}}{K_1\beta}}\right) \quad (26b)$$

Also, the output currents of the MOS differential pair are compressed to their square-roots and converted into corresponding voltages, by the transistors M3 and M4 each of which has a transistor size ratio $K_2$ with respect to the unit transistor as a load transistor. Here, a differential output voltage of the MOS differential pair becomes linear based on the following formula.

$$b\left(\sqrt{a+\sqrt{2x}\sqrt{1-\frac{x^2}{2}}} - \sqrt{a-\sqrt{2x}\sqrt{1-\frac{x^2}{2}}}\right) = b\sqrt{2x} \quad (27a)$$

where, $$a=1,\ b=\sqrt{(I_{SS}/2)},\ x=V_i/\sqrt{(I_{SS}/(K_1\beta))} \quad (27b)$$

Therefore, the following relation is obtained:

$$\sqrt{I_{D1}} - \sqrt{I_{D2}} = \sqrt{K_1\beta}\,V_i\left(|V_i| \le \sqrt{\frac{I_{SS}}{K_1\beta}}\right) \quad (28)$$

That is, a term $\sqrt{I_{D1}} - \sqrt{I_{D2}}$ becomes linear. Thus, the MOS differential pair has a linear term:

$$\sqrt{\sqrt{K_1\beta}V_i}(=\sqrt{I_{D1}}-\sqrt{I_{D2}}) \quad (29a)$$

and a non-linear term:

$$\sqrt{I_{D1}} + \sqrt{I_{D2}} = \sqrt{K_1\beta}\sqrt{\frac{2I_{SS}}{K_1\beta} - V_i^2}\left(|V_i| \le \sqrt{\frac{I_{SS}}{K_1\beta}}\right) \quad (29b)$$

The differential output current of the MOS differential pair is represented as follows:

$$\Delta I_D = I_{D1} - I_{D2} = \left(\sqrt{I_{D1}} - \sqrt{I_{D2}}\right)\left(\sqrt{I_{D1}} + \sqrt{I_{D2}}\right) \quad (30)$$

$$= K_1\beta V_i\sqrt{\frac{2I_{SS}}{K_1\beta} - V_i^2}\left(|V_i| \le \sqrt{\frac{I_{SS}}{K_1\beta}}\right)$$

The non-linear term of the above formula, i.e., $$\sqrt{K_1\beta}\sqrt{2I_{SS}/(K_1\beta)-V_i^2}(=\sqrt{I_{D1}}+\sqrt{I_{D2}}) \quad (30a)$$

is caused by a common source voltage of the MOS differential pair. The common source voltage $V_{S1}$ is represented as follows:

$$V_{S1} = V_{CM1} - V_{TH} - \frac{1}{2}\sqrt{\frac{2I_{SS}}{K_1\beta} - V_i^2} \quad (31)$$

In this formula, $V_{CM1}$ designates a common mode voltage of input voltages. Non-linearity behavior of the MOS differential pair is caused by the variations in the common source voltage depending on the input voltages. Therefore, if the common source voltage of the MOS differential pair is kept constant, the MOS differential pair operates linearly.

Output voltages of respective transistors which constitute the MOS differential pair and each of which is coupled to a load transistor are represented as follows:

$$V_{O1} = V_B - V_{TH} - \sqrt{\frac{I_{D1}}{K_2\beta}}\left(|V_i| \le \sqrt{\frac{I_{SS}}{K_1\beta}}\right) \quad (32)$$

$$V_{O2} = V_B - V_{TH} - \sqrt{\frac{I_{D2}}{K_2\beta}}\left(|V_i| \le \sqrt{\frac{I_{SS}}{K_1\beta}}\right) \quad (33)$$

where, $V_B$ designates a gate bias voltage of a load transistor.

Therefore, a differential output voltage becomes as follows:

$$V_{O1} - V_{O2} = -\sqrt{\frac{K_1}{K_2}}\,V_i\left(|V_i| \le \sqrt{\frac{I_{SS}}{K_1\beta}}\right) \quad (34)$$

Here, if $K_2/K_1$ is larger than 1, the MOS differential pair having transistor loads becomes an attenuator having an opposite output phase, and, if $K_2/K_1$ is smaller than 1, the MOS differential pair becomes an amplifier having an opposite output phase. As shown by the formula (34), the MOS differential pair having transistor loads becomes linear with respect to the differential output voltage.

Figure 4:
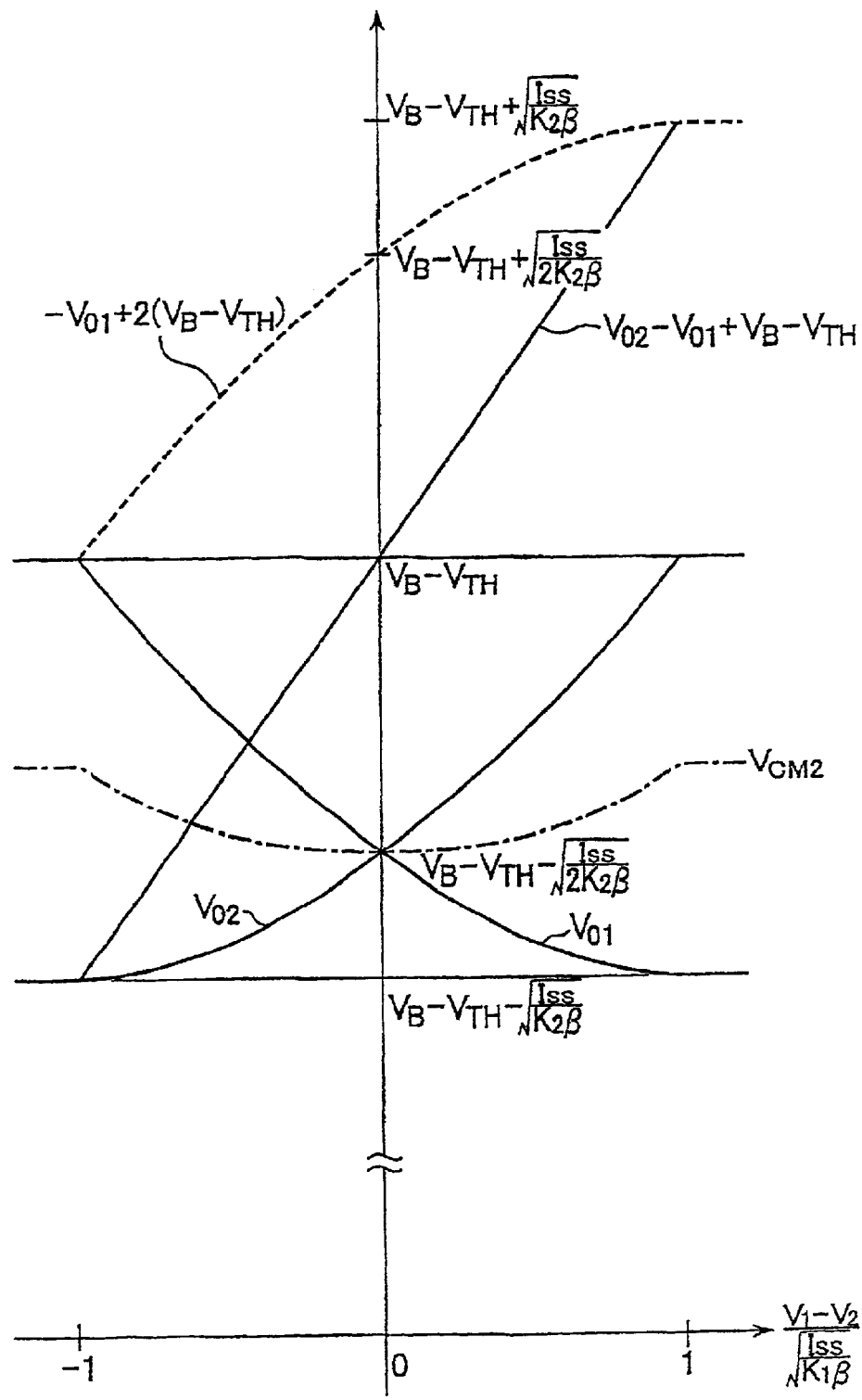
FIG. 4 is a graph showing characteristics of output voltages of a MOS differential pair having load transistors shown in FIG. 3.

FIG. 4 is a graph showing characteristics of output voltages of the MOS differential pair having transistor loads.

The common mode voltage of the output voltages becomes as follows:

$$V_{CM2} = \frac{V_{o1} + V_{o2}}{2} = V_B - V_{TH} - \sqrt{\frac{I_{D1}}{K_2\beta}} - \sqrt{\frac{I_{D2}}{K_2\beta}} \quad (35)$$

$$= V_B - V_{TH} - \frac{1}{2}\sqrt{\frac{K_1}{K_2}}\sqrt{\frac{2I_{SS}}{K_1\beta} - V_i^2}$$

$$= V_B - V_{TH} - \sqrt{\frac{K_1}{K_2}}(V_{CM1} - V_{TH} - V_{S1})\left(|V_i| \le \sqrt{\frac{I_{SS}}{K_1\beta}}\right)$$

That is, the common mode voltage of the differential output voltage of the MOS differential pair having transistor loads can be represented by using the common source voltage $V_{s1}$.

Next, consideration will be made on a MOS quadri-tail cell in which source electrodes of unit transistors M5 and M6 and source electrodes of transistors M7 and M8 whose transistor size ratios with respect to the unit transistor are $K_3$ are commonly connected and driven by a constant current source $I_0$. Assuming that a voltage $\Delta V$ is applied between gate electrodes of the transistors M5 and M6 and that a voltage $V_C$ is applied between the common gate of the transistors M7 and M8 and the input common mode voltage ($V_{CM3}$), drain currents of the transistors M5, M6, M7 and M8 are represented as follows:

$$I_{D5}=\beta\{V_{CM3}+(\tfrac{1}{2})\Delta V-V_{S2}-V_{TH}\}^2 \quad (36)$$

$$I_{D6}=\beta\{V_{CM3}-(\tfrac{1}{2})\Delta V-V_{S2}-V_{TH}\}^2 \quad (37)$$

$$I_{D7}=I_{D8}=K_3\beta(V_{CM3}+V_C-V_{S2}-V_{TH})^2 \quad (38)$$

where, $V_{S2}$ designates a common source voltage of the MOS quadri-tail cell.

Also, from the condition of the tail current, the following formula is obtained.

$$I_{D5}+I_{D6}+I_{D7}+I_{D8}=I_0 \quad (39)$$

By substituting formulas (36) through (38) for the formula (39), it is possible to obtain a term $(V_{CM3}-V_{S2}-V_{TH})$ as follows:

$$V_{CM3} - V_{S2} - V_{TH} = \quad (40)$$

$$\frac{-K_3 V_c + \sqrt{(K_3+1)\frac{I_0}{2\beta} - \frac{K_3+1}{4}(\Delta V)^2 - K_3 V_c^2}}{K_3+1}$$

The differential output current ΔI of the MOS quadri-tail cell can be obtained as described in "Appendix 2" of a paper "MOS Linear and Square-Law Transconductance Amplifiers Consisting of a Source-Coupled Pair with Load Transistors and a Quadritail Cell Using Only N-Channel MOS Unit Transistors" (CAS98-41), Institute of Electronics, Information and Communication Engineers, Technical Report of Research Committee of Circuit and System, pp. 17–24, July 1998. As described in this paper, the differential output current $\Delta I = I_{D5} - I_{D6} = 2\beta(\Delta V)(V_{CM3}-V_{S2}-V_{TH})$ can be represented as follows:

$$\Delta I = I_{D5} - I_{D6} = 2\beta(\Delta V)(V_{CM3}-V_{S2}-V_{TH}) = \quad (41)$$

$$\frac{-2K_3\beta(\Delta V)V_c + 2\beta(\Delta V)\sqrt{(K_3+1)\frac{I_0}{2\beta} - \frac{K_3+1}{4}(\Delta V)^2 - K_3 V_c^2}}{K_3+1}$$

$$|\Delta V| \le \min\left\{\sqrt{\frac{2I_0}{\beta}-4V_c^2}, \frac{-K_3 V_c + 2\sqrt{(K_3+1)\frac{I_0}{\beta}-2K_3 V_c^2}}{K_3+2}\right\}$$

From the formula (41), the condition that the MOS quadri-tail cell operates linearly becomes as follows:

$$-K_3 V_c + \sqrt{(K_3+1)\frac{I_0}{2\beta} - \frac{K_3+1}{4}(\Delta V)^2 - K_3 V_c^2} = c(constant) \quad (42)$$

Here, the differential output current becomes as follows:

$$\Delta I = \frac{2c\beta}{K_3+1}(\Delta V) \quad (43)$$

Also, the control voltage $V_C$ can be obtained from the following relation.

$$V_c = \frac{-K_3 c + \sqrt{K_3(K_3+1)^2 \frac{I_0}{2\beta} - \frac{K_3(K_3+1)^2}{4}(\Delta V)^2 - K_3 c^2}}{K_3(K_3+1)} \quad (44)$$

For example, when $C^2 = (K_3+1)^2 I_0/(4\beta)$, the control voltage $V_C$ becomes as follows:

$$V_c = -\frac{1}{2}\sqrt{\frac{I_0}{\beta}} + \sqrt{\frac{I_0}{K_3\beta} - \frac{1}{K_3}(\Delta V)^2} \quad (45)$$

As shown in FIG. 3, by cascade-coupling the MOS differential pair having transistor loads and the MOS quadri-tail cell, it is possible to realize a linear transconductance amplifier. The gate voltages of the transistors M5, M6 and M7 become $V_{O1}$, $V_{O2}$ and $(V_{CM2}+V_C)$, respectively. If the value $(V_{CM2}+V_C)$ becomes a constant value, it is possible to greatly simplify the structure of a gate bias circuit for producing the control voltage $V_C$. Here, $\Delta V = V_{O1} - V_{O2}$, and $V_{CM3} = V_{CM2}$. The value of $(V_{CM2}+V_C)$ is represented as follows:

$$V_{CM2} + V_C = V_B - V_{TH} - \frac{1}{2}\sqrt{\frac{K_1}{K_2}}\sqrt{\frac{2I_{SS}}{K_1\beta}-V_i^2} + \quad (46)$$

$$\frac{-K_3 c + \sqrt{K_3(K_3+1)^2 \frac{I_0}{2\beta} - \frac{K_3(K_3+1)^2}{4}(\Delta V)^2 - K_3 c^2}}{K_3(K_3+1)} =$$

$$d(constant)$$

Therefore, the requirement for linear operation of the circuit of FIG. 3 is that term or terms which are functions of the input voltage Vi become zero, and the following relation is obtained.

$$V_{CM2} + V_C = V_B - V_{TH} - \frac{c}{K_3+1} = d(constant) \quad (47)$$

From the condition that the formula (46) and the formula (47) become equal to each other, the following relations are obtained.

$$K_3 = 1 \quad (48)$$

$$\frac{I_0}{\beta} = \frac{I_{SS}}{K_2\beta} + \frac{c^2}{2} \quad (49)$$

Also, when Vi=0 in the formula (46), the formula (47) is satisfied even when $V_C = 0$, and the following relations can be obtained.

$$d = V_B - V_{TH} - \sqrt{\frac{I_{SS}}{2K_2\beta}} \quad (50)$$

$$c = 4\sqrt{\frac{I_{SS}}{2K_2\beta}} = 2\sqrt{\frac{2I_{SS}}{K_2\beta}} \quad (51)$$

By substituting the formula (51) for the formula (49), the following relation is obtained.

$$I_0 = 2\frac{I_{SS}}{K_2} \quad (52)$$

Figure 5:
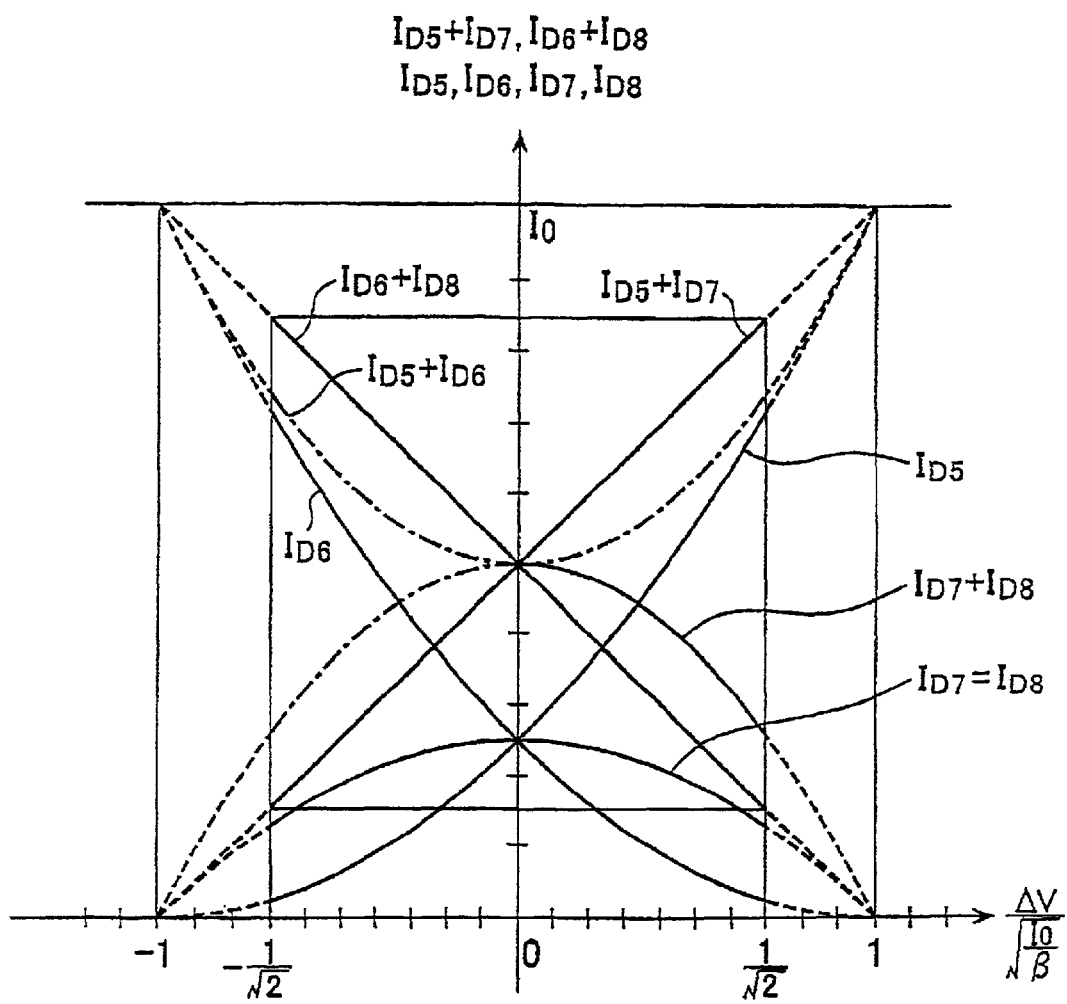
FIG. 5 is a graph showing characteristics of output currents of a quadri-tail cell shown in FIG. 3.

FIG. 5 shows drain currents of respective transistors constituting the quadri-tail cell obtained in this way. In FIG. 5, $\Delta V = V_{O1} - V_{O2}$.

Both the drain currents $I_{D5}$ and $I_{D6}$ the transistors M5 and M6 are currents which satisfy the square-law. Therefore, the differential output current becomes linear, and the circuit of FIG. 3 constitutes a MOS linear transconductance amplifier. Also, both the sum of the drain currents $I_{D5}$ and $I_{D7}$ and the sum of the drain currents $I_{D6}$ and $I_{D8}$ show straight lines. Therefore, the respective drain currents are obtained by the following formulas.

$$I_{D5} = \frac{\beta}{4}\left(\Delta V - \sqrt{\frac{I_0}{\beta}}\right)^2 \left(|\Delta V| \le \sqrt{\frac{I_0}{2\beta}}\right) \quad (53)$$

$$I_{D6} = \frac{\beta}{4}\left(\Delta V + \sqrt{\frac{I_0}{\beta}}\right)^2 \left(|\Delta V| \le \sqrt{\frac{I_0}{2\beta}}\right) \quad (54)$$

$$I_{D7} = I_{D8} = \frac{1}{4}\{I_0 + \beta(\Delta V)^2\}\left(|\Delta V| \le \sqrt{\frac{I_0}{2\beta}}\right) \quad (55)$$

Thus, an effective tail current of the two transistors constituting the differential pair of the quadri-tail cell becomes as follows:

$$I_{D5} + I_{D6} = \frac{1}{2}\{I_0 + \beta(\Delta V)^2\}\left(|\Delta V| \le \sqrt{\frac{I_0}{2\beta}}\right) \quad (56)$$

The circuit structure can be most simplified when $K_1=1$, $K_2=1$, $K_3=1$ and $I_{ss}=I_0$. In such case, the value of the constant c becomes as follows:

$$c = 2\sqrt{\frac{I_0}{\beta}} \quad (57)$$

Also, in this case, the following relations are obtained.

$$d = V_{CM2} + V_C = V_B - V_{TH} - 2\sqrt{\frac{I_0}{\beta}} \quad (58)$$

$$V_C = \frac{1}{2}\left\{-\sqrt{\frac{I_0}{\beta}} + \sqrt{\frac{I_0}{\beta} - (\Delta V)^2}\right\} \quad (59)$$

The differential output current of the linear transconductance amplifier shown in FIG. 3 is represented as follows:

$$\Delta I = I_{D5} - I_{D6} = -\sqrt{\beta I_0}\, V_i \left(|V_i| \le \sqrt{\frac{I_0}{2\beta}}\right) \quad (60)$$

An operation range of such linear transconductance amplifier shown by the relation $|V_i| \le \sqrt{\{I_0/(2\beta)\}}$ becomes equal to the operation range of the MOS differential pair having transistor loads.

Transconductance of such linear transconductance amplifier becomes as follows:

$$\frac{d(\Delta V)}{dV_i} = -\sqrt{\beta I_0}\left(|V_i| \le \sqrt{\frac{I_0}{2\beta}}\right) \quad (61)$$

The common source voltage $V_{S2}$ can be obtained by using the formula (39) as follows:

$$V_{S2} = \frac{V_1 + V_2}{2} - V_{TH} - \frac{1}{2}\sqrt{\frac{I_0}{\beta}} \quad (62)$$

Figure 6:
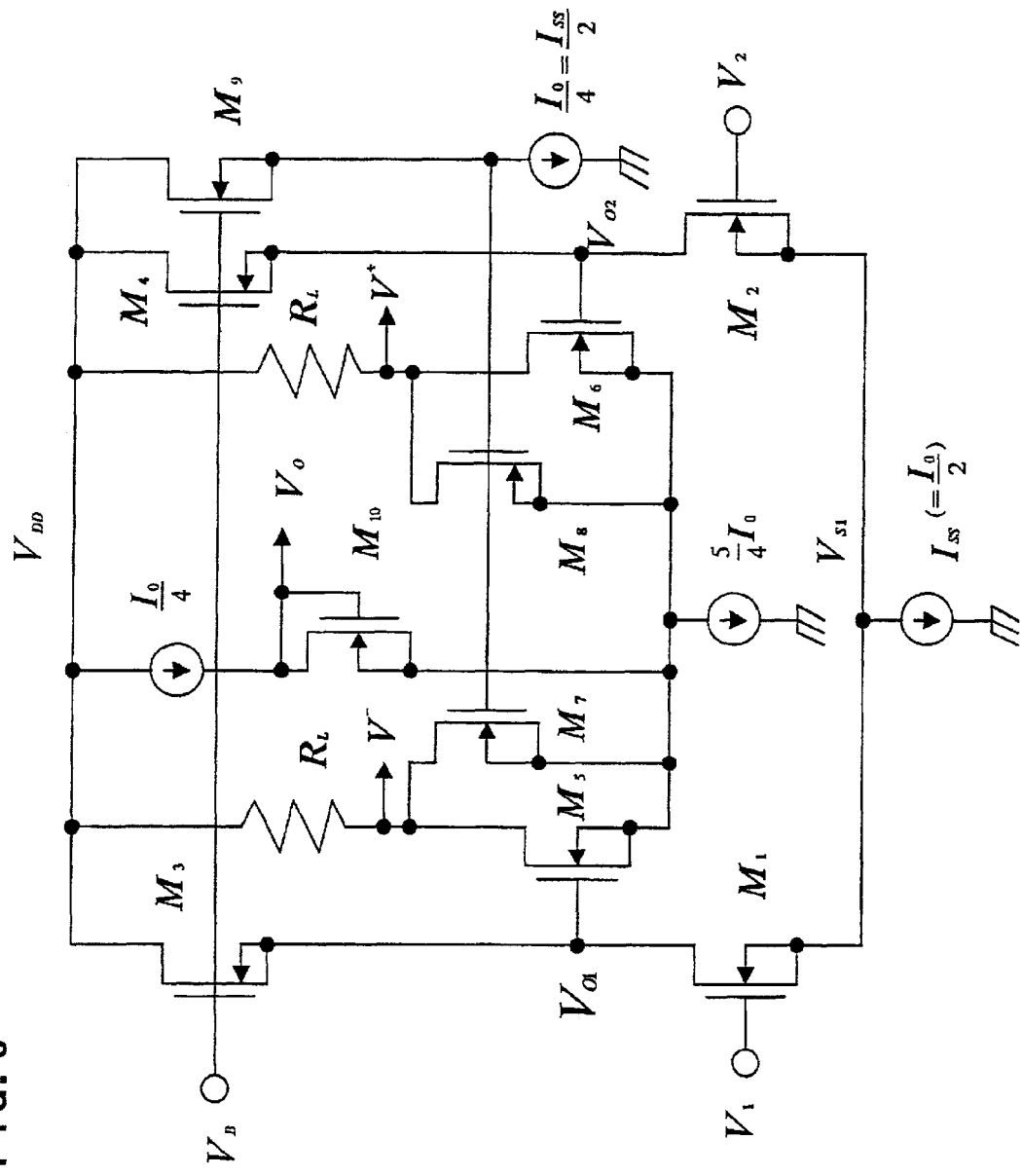
FIG. 6 is a circuit diagram showing a structure of a voltage subtractor/adder circuit, which includes a level shifter, according to still another embodiment of the present invention.

Therefore, an added voltage or a sum of the input voltages can be obtained. As shown by the formula (62), the common source voltage $V_{S2}$ includes an offset voltage $-V_{TH}-(\frac{1}{2})\sqrt{(I_0/\beta)}$ which is a constant voltage. FIG. 6 shows a circuit in which such offset voltage can be removed to obtain the added voltage $(V_1+V_2)/2$. In the circuit of FIG. 6, the common source voltage $V_{S2}$ is level-shifted by a unit transistor which is diode-coupled and which is driven by a constant current source $I_0$.

Figure 7:
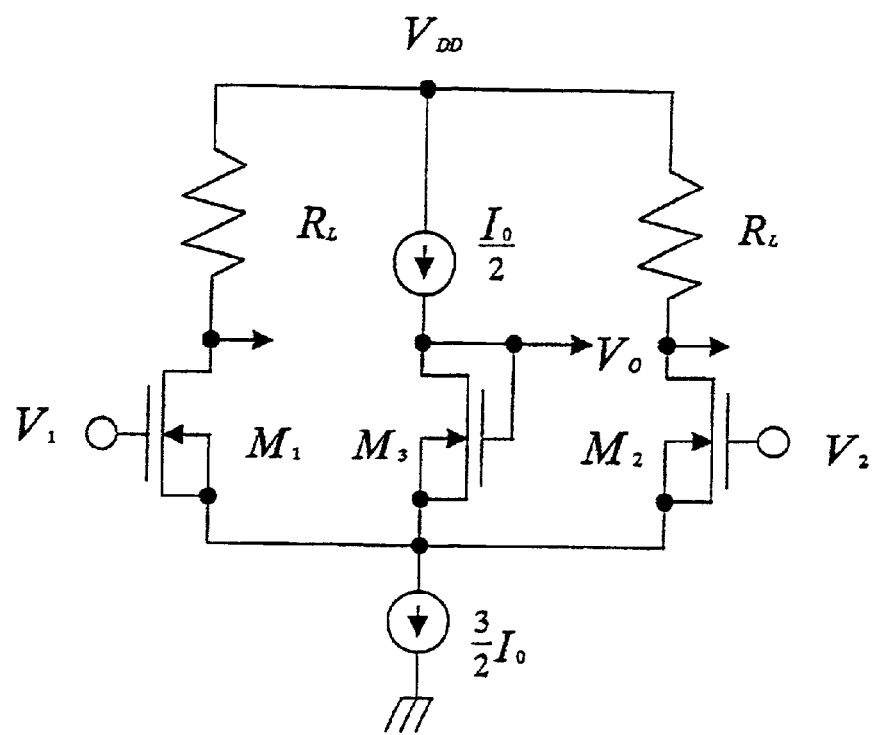
FIG. 7 is a circuit diagram showing a structure of a voltage subtractor/adder circuit, which includes a level shifter, according to still another embodiment of the present invention.

The above-mentioned voltage subtractor/adder circuit can produce linear subtraction and addition outputs. However, in some cases, it is also preferable to provide a voltage subtractor/adder circuit which has more simple structure and smaller circuit scale although linearity performance may be slightly deteriorated. FIG. 7 shows a simplified voltage subtractor/adder circuit as another embodiment of the present invention.

The circuit of FIG. 7 comprises a level-shifting circuit or a level shifter including a MOS transistor M3, and a MOS differential pair including MOS transistors M1 and M2. As a voltage subtractor circuit, the circuit of FIG. 7 provides an output voltage having linearity corresponding to that of the usual MOS differential pair, as shown by the formula (19). Also, as a voltage adder circuit, the circuit of FIG. 7 provides an output voltage having linearity equivalent to that of the usual MOS differential pair as can be seen from the formula (31) and as shown by the curve of $V_{CM2}$ in FIG. 4. The output voltage of the voltage adder circuit becomes as follows:

$$V_0 = \frac{V_1 + V_2}{2} + \frac{1}{2}\sqrt{\frac{I_0}{\beta}} - \frac{1}{2}\sqrt{\frac{I_0}{\beta} - V_i^2} \quad (63)$$

From the formula (63), when the differential input voltage $|V_i|$ is relatively small, this formula can be approximated to the following:

$$V_0 \approx \frac{V_1 + V_2}{2} \quad (64)$$

Also, as can be seen from the formula (63) and as shown by the curve of $V_{CM2}$ in FIG. 4, the output voltage of the voltage adder circuit becomes large as the differential input voltage $|V_i|$ becomes large.

Figure 8:
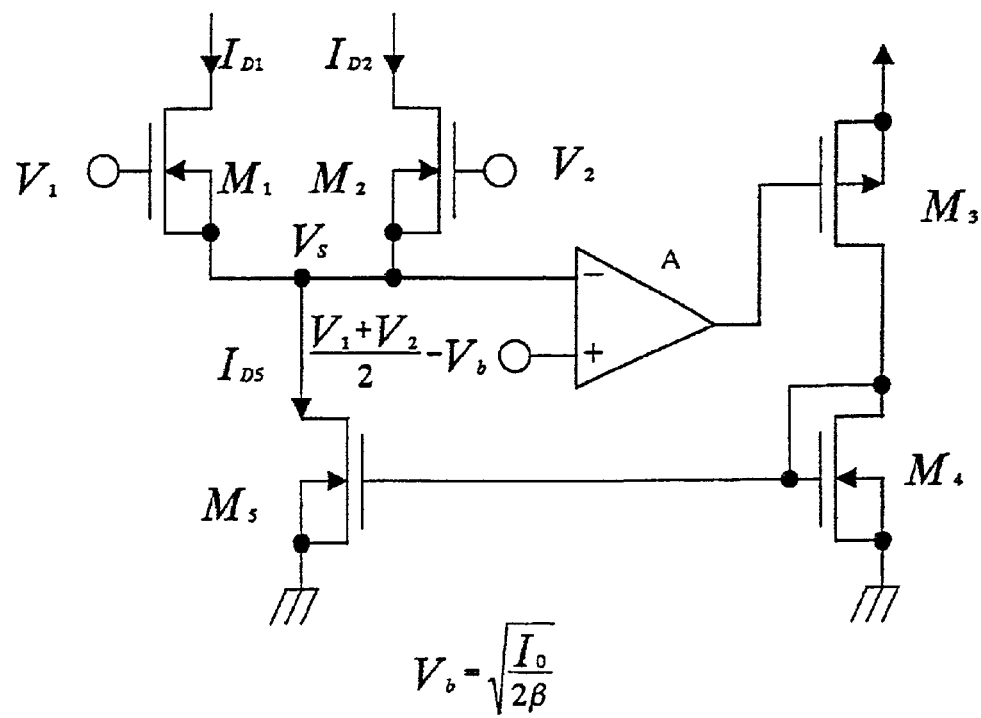
FIG. 8 is a circuit diagram showing a structure of a MOS differential amplifier circuit according to an embodiment of the present invention.

Next, an explanation will be made on a method of constituting a MOS differential pair which has linear transconductance and which can be used for realizing a voltage adder circuit and/or a voltage subtractor circuit. FIG. 8 shows a MOS differential amplifier circuit including such MOS differential pair.

In the circuit of FIG. 8, assuming that a transconductance parameter of each of the transistors M1 and M2 is $\beta$, a common source voltage Vs' of the MOS differential pair is represented as follows:

$$V_S' = V_{CM} - V_{TH} - \frac{1}{2}\sqrt{\frac{2I_0}{\beta} - V_i^2}\quad \left(|V_i| \le \sqrt{\frac{I_0}{\beta}}\right) \quad (65)$$

where, $V_{CM}$ is a common mode voltage of input voltages, and represented by the following formula:

$$V_{CM} = \frac{V_1 + V_2}{2} \quad (66)$$

In this formula, $V_1$ and $V_2$ designate gate voltages of the transistors M1 and M2, respectively.

In the formula (65), Vi designates a differential input voltage of the MOS differential pair, and $V_i = V_1 - V_2$. Therefore, the common source voltage Vs' of the MOS differential pair becomes high according to an increase in the differential input voltage Vi. When the common source voltage Vs' of the MOS differential pair varies depending on the value of the differential input voltage Vi, the MOS differential pair does not operate linearly. That is, when the common source voltage Vs' becomes constant with respect to the common mode voltage $V_{CM}$, the MOS differential pair operates linearly. Here, when the tail current of the MOS differential pair is increased according to an increase in the differential input voltage Vi, the gate-source voltage of each of the transistors M1 and M2 becomes large in accordance with an increase in the differential input voltage Vi. Therefore, in such case, it is possible to cancel a voltage raise in the common source voltage Vs' according to an increase in the differential input voltage Vi, and to make the common source voltage Vs' constant with respect to the common mode voltage $V_{CM}$. In this manner, an operational amplifier A, transistors M3, M4 and M5 constitute a feedback loop, and function to keep the common source voltage Vs' constant with respect to the common mode voltage $V_{CM}$. Therefore, the MOS differential pair shown in FIG. 8 operates linearly.

As mentioned above, by changing the tail current for driving the MOS differential pair depending on the differential input voltage Vi such that the common source voltage Vs' becomes constant with respect to the common mode voltage $V_{CM}$, it is possible to realize the MOS differential pair which operates linearly.

In such case, the common source voltage Vs of the MOS differential pair is represented as follows:

$$V_S = V_{CM} - V_{TH} - \sqrt{\frac{I_0}{2\beta}} \qquad (67)$$

Also, the tail current Iss driving the MOS differential pair becomes as follows:

$$I_{SS} = I_{D5} = I_{D1} + I_{D2} = I_0 + \frac{1}{2}\beta V_i^2 \qquad (68)$$

Therefore, it is possible to realize an adaptive-biasing differential pair and to realize a CMOS differential amplifier circuit having linear transconductance. Also, theoretically, an input voltage range for linear operation becomes infinite, if the tail current Iss is not limited.

The differential output current ΔI of the linear transconductance amplifier shown in FIG. 8 becomes as follows:

$$\Delta I = I_{D5} - I_{D6} = -\sqrt{\beta I_0} V_i \qquad (69)$$

Also, the transconductance becomes as follows:

$$\frac{d(\Delta V)}{dV_i} = -\sqrt{\beta I_0} \qquad (70a)$$

Figure 9:
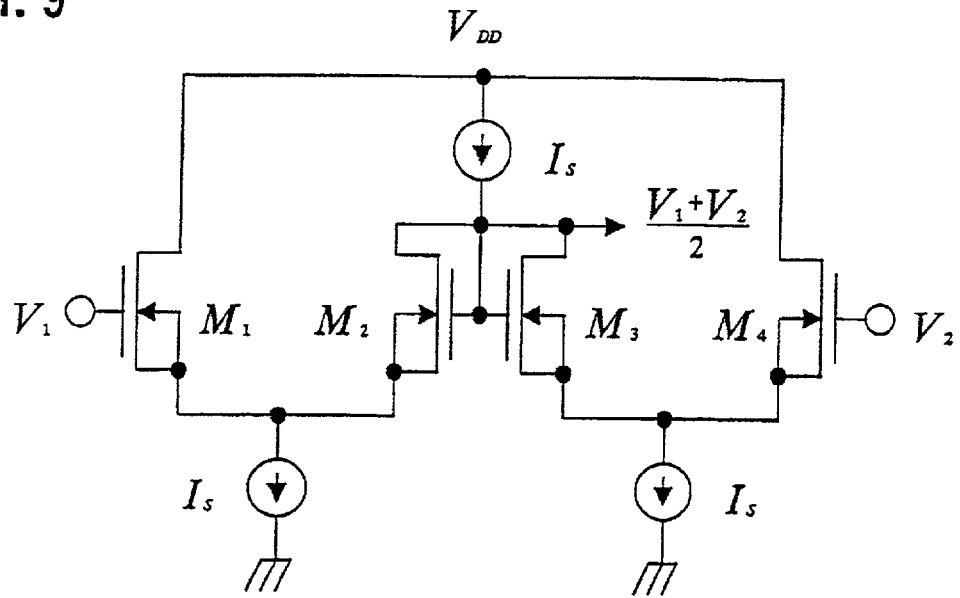
FIG. 9 is a circuit diagram showing an example of an adder circuit for producing an input common mode voltage.

As a circuit for obtaining the common mode voltage $V_{CM}$, there is known a voltage adder circuit shown in FIG. 9, for example. Also, when an input impedance is allowed to become relatively low, it is possible to obtain the common mode voltage $V_{CM}$ from a coupling point of two resistors coupled in series.

Figure 10:
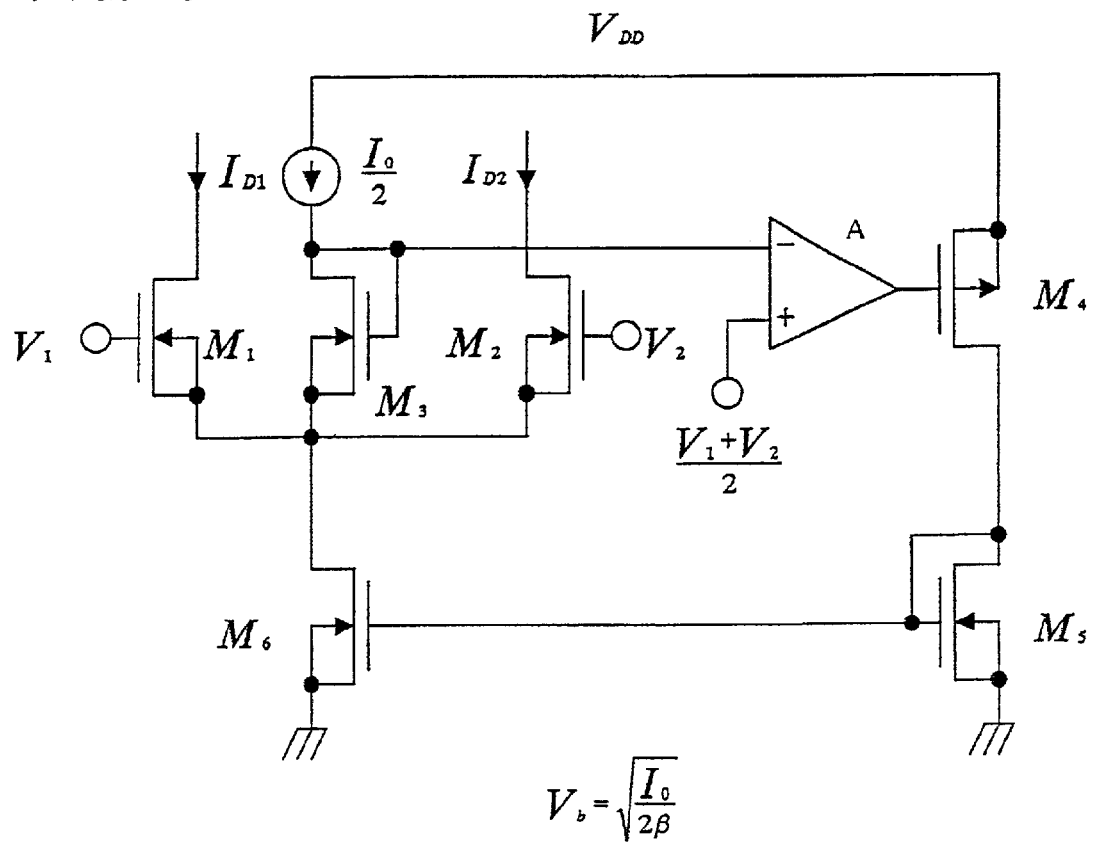
FIG. 10 is a circuit diagram showing a structure of a MOS differential amplifier circuit according to another embodiment of the present invention.

As shown in FIG. 10, it is also possible to use a level shifter to level-shift the common source voltage Vs. When the differential input voltage is applied within a range +/−Vi and the center of the differential input voltage +/−Vi is the common mode voltage $V_{CM}$ which is a constant voltage, the voltage adder circuit shown in FIG. 9 is not required.

Figure 11:
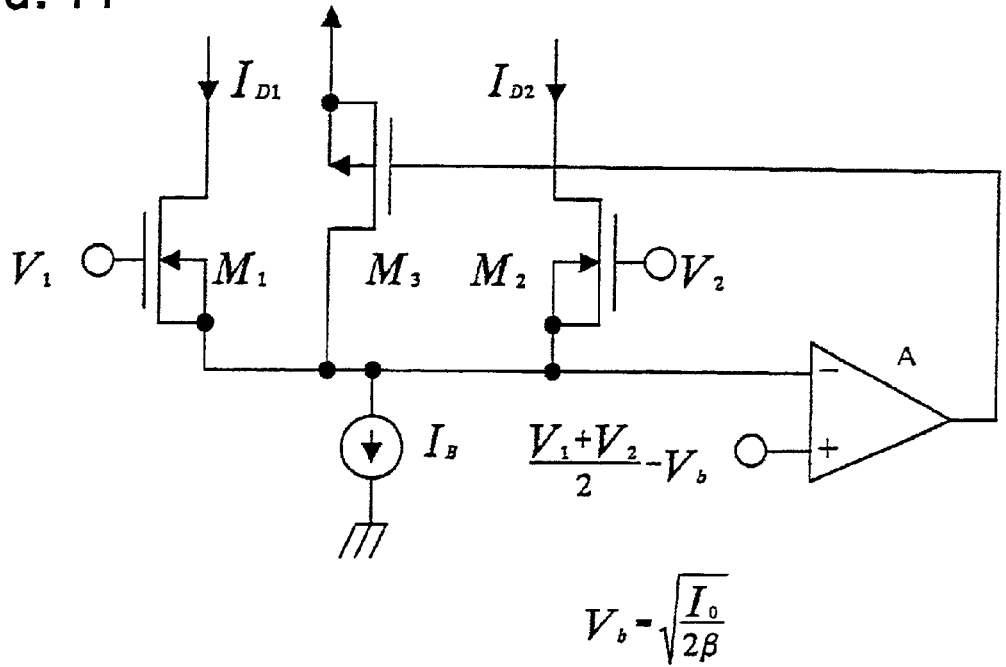
FIG. 11 is a circuit diagram showing a structure of a MOS differential amplifier circuit according to still another embodiment of the present invention.

FIG. 11 shows a MOS differential amplifier circuit according to still another embodiment of the present invention.

In an adaptive-biasing differential pair, it is required that the sum of currents flowing through the transistors M1 and M2 constituting a MOS differential pair becomes a current having the square-law characteristic as shown in the formula (68). Therefore, as shown in FIG. 11, it is possible to supply or inject a drain current $I_{D3}$ of the transistor M3 into a constant current source $I_B$. An operational amplifier A and the transistor M3 constitute a feedback loop, and function to keep the common source voltage Vs constant with respect to the common mode voltage $V_{CM}$. Therefore, the sum of currents flowing through the transistors M1 and M2 becomes as follows:

$$I_B - I_{D3} = I_{D1} + I_{D2} = I_0 + \frac{1}{2}\beta V_i^2 \quad \left(|V_i| \leq \sqrt{\frac{I_B}{\beta}}\right) \qquad (70b)$$

Thus, it is also possible to realize an adaptive-biasing differential pair by using the circuit of FIG. 11, and to realize a CMOS differential amplifier circuit having a linear transconductance. Also, an input voltage range providing linear operation of the CMOS differential amplifier circuit is limited by the performance of the constant current source $I_B$.

Figure 12:
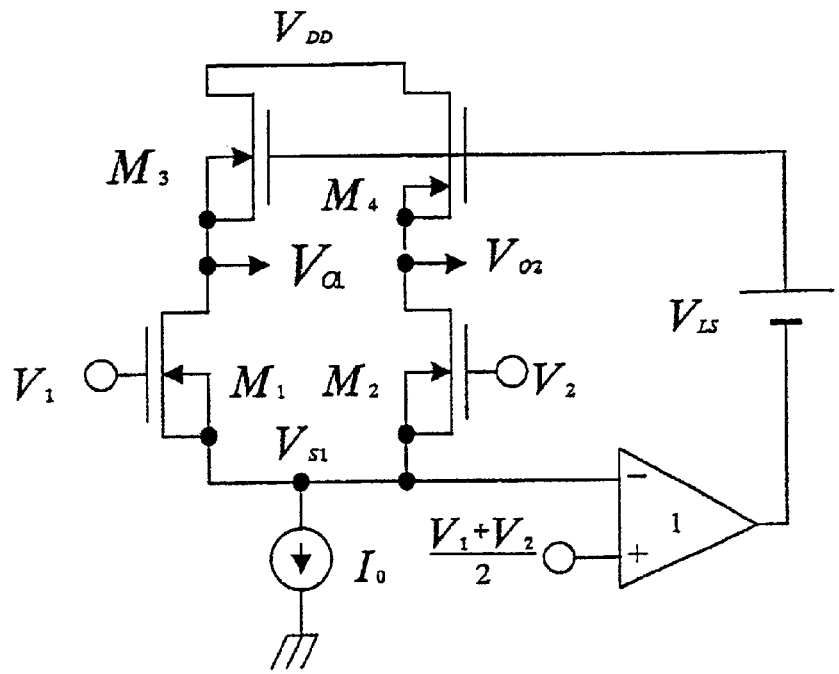
FIG. 12 is a circuit diagram showing a structure of a MOS differential amplifier circuit according to still another embodiment of the present invention.

With reference to the drawings, more concrete examples of the MOS differential amplifier circuit will be described. FIG. 12 shows a MOS differential amplifier circuit having transistor loads.

In FIG. 12, assume that all transistors M1, M2, M3 and M4 have the same transistor size, and that the transconductance parameter is β. In such case, the common source voltage $V_{S1}$ of the MOS differential pair can be represented as follows:

$$V_{S1} = V_{LS} + V_{TH} - \frac{1}{2}\sqrt{\frac{2I_0}{\beta} - V_i^2} \quad \left(|V_i| \leq \sqrt{\frac{I_0}{\beta}}\right) \qquad (71)$$

where, $V_{CM1}$ is a common mode voltage of input voltages and represented by the following formula:

$$V_{CM1} = \frac{V_1 + V_2}{2} \qquad (72)$$

In this formula, $V_1$ and $V_2$ are gate voltages of the transistors M1 and M2, respectively. Also, $V_1 - V_2 = Vi$. Therefore, in a unity gain amplifier, a voltage $V_B$, which is obtained by subtracting the common source voltage $V_{S1}$ from the common mode voltage $V_{CM1}$ and by level-shifting the subtracted voltage by $V_{LS}$, becomes a common gate voltage of the transistors M3 and M4. That is, $V_B = V_{CM1} - V_{S1} + V_{LS}$ becomes the common gate voltage of the transistors M3 and M4 and represented as follows:

$$V_B = V_{CM1} - V_{S1} + V_{LS} \qquad (73)$$

$$= V_{LS} + V_{TH} + \frac{1}{2}\sqrt{\frac{2I_0}{\beta} - V_i^2}$$

Therefore, output voltages $V_{O1}$ and $V_{O2}$ can be obtained as follows:

$$V_{O1} = V_B - V_{TH} = \sqrt{\frac{I_{D1}}{\beta}} \qquad (74a)$$

$$= V_{LS} + \frac{1}{2}\sqrt{\frac{2I_0}{\beta} - V_i^2} - \sqrt{\frac{1}{2}\left(\frac{I_0}{2} - \sqrt{\frac{2I_0}{\beta} - V_i^2}\right)} \quad \left(|V_i| \leq \sqrt{\frac{I_0}{\beta}}\right)$$

$$V_{O2} = V_B - V_{TH} = \sqrt{\frac{I_{D2}}{\beta}} \qquad (74b)$$

$$= V_{LS} + \frac{1}{2}\sqrt{\frac{2I_0}{\beta} - V_i^2} - \sqrt{\frac{1}{2}\left(\frac{I_0}{2} - \sqrt{\frac{2I_0}{\beta} - V_i^2}\right)} \quad \left(|V_i| \leq \sqrt{\frac{I_0}{\beta}}\right)$$

From the identity of (27), the following relation is obtained.

$$\sqrt{\frac{I_0}{2} + \sqrt{\frac{2I_0}{\beta} - V_i^2}} - \sqrt{\frac{I_0}{2} - \sqrt{\frac{2I_0}{\beta} - V_i^2}} = \sqrt{2}\, V_i \qquad (75a)$$

Also, from the identity of (29), the following relation is obtained.

$$\sqrt{\frac{I_0}{2} + \sqrt{\frac{2I_0}{\beta} - V_i^2}} + \sqrt{\frac{I_0}{2} - \sqrt{\frac{2I_0}{\beta} - V_i^2}} = \sqrt{2}\sqrt{\frac{2I_0}{\beta} - V_i^2} \qquad (75b)$$

Therefore, the output voltages $V_{O1}$ and $V_{O2}$ can be represented as follows:

$$V_{O1} = V_{LS} - \frac{V_i}{2} \qquad (76a)$$

$$V_{O2} = V_{LS} - \frac{V_i}{2} \qquad (76b)$$

Thus, the output voltages $V_{O1}$ and $V_{O2}$ behave linearly about an operating point having the DC voltage $V_{LS}$. Therefore, a MOS differential amplifier circuit having opposite polarities is obtained. As an example of a practical circuit for obtaining a common mode voltage of input voltages, it is possible to use the adder circuit of FIG. 9 as it is.

Figure 13:
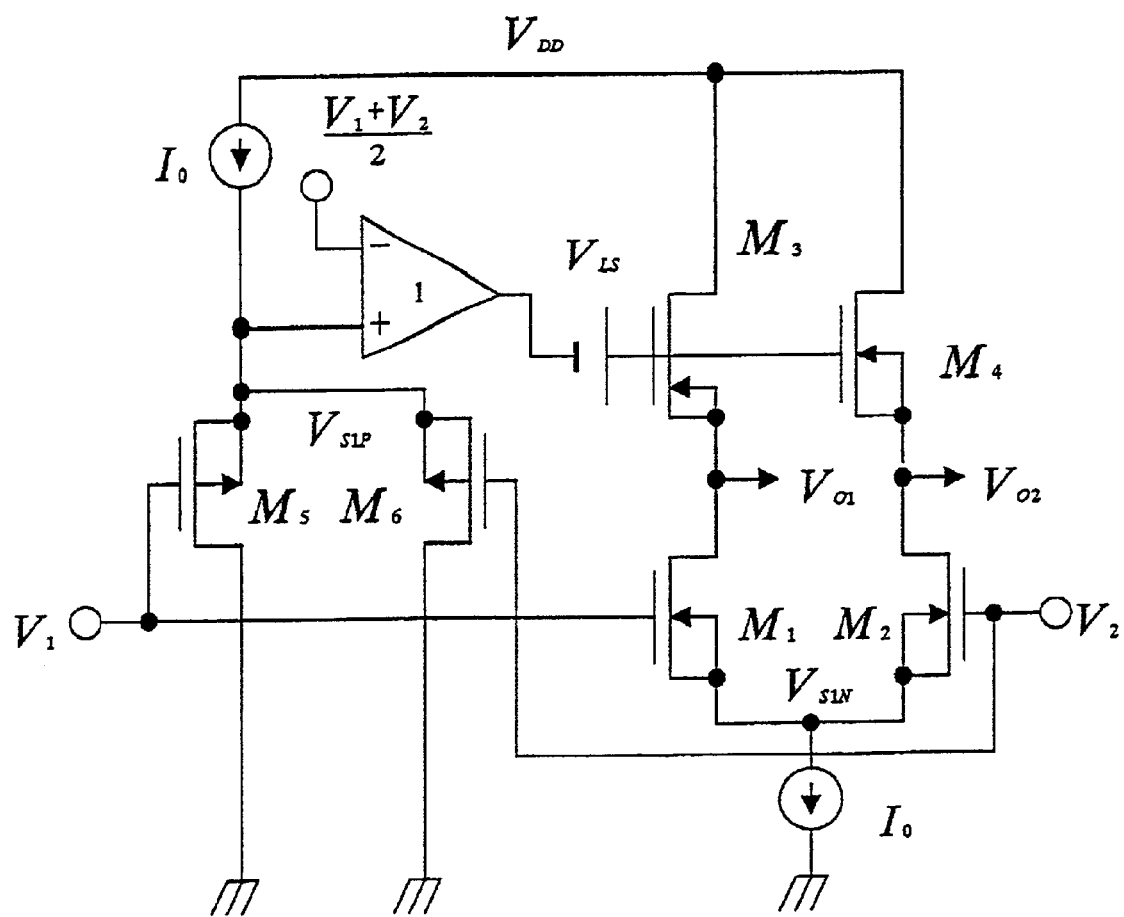
FIG. 13 is a circuit diagram showing a structure of a MOS differential amplifier circuit according to still another embodiment of the present invention.

As another method of obtaining a voltage having opposite polarity of the common source voltage, there is described a method in which a MOS differential pair composed of P-channel transistors is used. FIG. 13 shows an example of a circuit for realizing such method.

In FIG. 13, assume that a transconductance parameter of each P-channel transistor is $\beta_P$ $(=\mu_P(C_{OX}/2)(W/L))$, and that a transconductance parameter of each N-channel transistor is $\beta_N$ $(=\mu_N(C_{OX}/2)(W/L))$. In this case, a common source voltage $V_{S1P}$ of the MOS differential pair comprising P-channel transistors is represented as follows:

$$V_{S1P} = V_{CM1} + |V_{THP}| + \frac{1}{2}\sqrt{\frac{2I_0}{\beta_P} - V_i^2} \quad \left(|V_i| \leq \sqrt{\frac{I_0}{\beta_P}}\right) \qquad (77)$$

Therefore, in a unity gain amplifier, a voltage $V_B$, which is obtained by subtracting the common mode voltage $V_{CM1}$ from the common source voltage $V_{S1}$ and by level-shifting the subtracted voltage by $V_{LS}$, becomes a common gate voltage of the transistors M3 and M4. That is, $V_B = V_{S1P} - V_{CM1} + V_{LS}$ becomes the common gate voltage of the transistors M3 and M4 and represented as follows:

$$V_B = V_{S1P} - V_{CM1} + V_{LS} \qquad (78)$$

$$= |V_{THP}| + \frac{1}{2} = |V_{THP}| + \frac{1}{2}\sqrt{\frac{2I_0}{\beta_P} - V_i^2}$$

Therefore, output voltages $V_{O1}$ and $V_{O2}$ can be obtained as follows:

$$V_{O1} = V_B - V_{THN} - \sqrt{\frac{I_{D1}}{\beta_N}} \qquad (79a)$$

$$= V_{LS} + |V_{THN}| - V_{THN} + \frac{1}{2}\sqrt{\frac{2I_0}{\beta_P} - V_i^2} - \sqrt{\frac{1}{2}\left(\frac{I_0}{2} + \sqrt{\frac{2I_0}{\beta_N} - V_i^2}\right)}$$

$$V_{O2} = V_{LS} - V_{THN} - \sqrt{\frac{I_{D2}}{\beta_N}} \qquad (79b)$$

$$= V_{LS} + |V_{THN}| - V_{THN} + \frac{1}{2}\sqrt{\frac{2I_0}{\beta_P} - V_i^2} - \sqrt{\frac{1}{2}\left(\frac{I_0}{2} + \sqrt{\frac{2I_0}{\beta_N} - V_i^2}\right)}$$

When $\beta_N = \beta_P$, the output voltages $V_{O1}$ and $V_{O2}$ can be represented as follows:

$$V_{O1} = V_B + |V_{THN}| - V_{THN} - \frac{V_i}{2} \qquad (80a)$$

$$V_{O2} = V_B + |V_{THN}| - V_{THN} + \frac{V_i}{2} \qquad (80b)$$

Thus, the output voltages $V_{O1}$ and $V_{O2}$ behave linearly about an operating point having a DC voltage $V_{LS} + |V_{THP}| - V_{THN}$. Therefore, a MOS differential amplifier circuit having opposite polarities is obtained.

Figure 14:
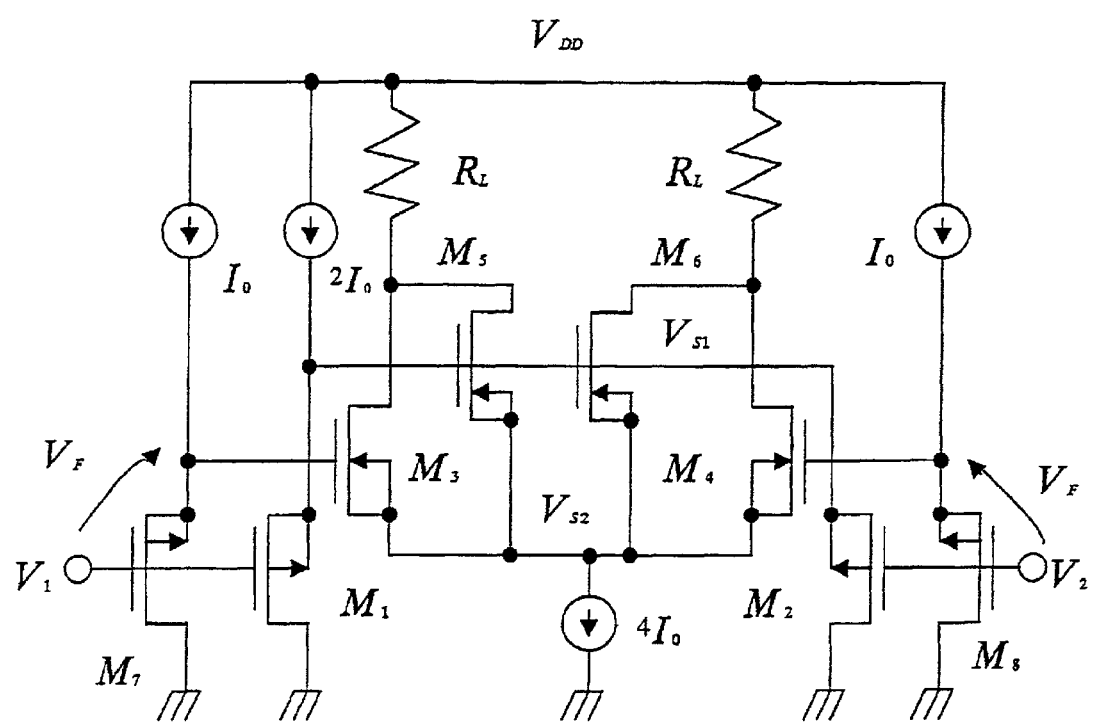
FIG. 14 is a circuit diagram showing a structure of a MOS differential amplifier circuit according to still another embodiment of the present invention.

In each of the MOS differential amplifier circuits mentioned above, a unity gain amplifier as a subtractor is required. In order to omit the unity gain amplifier, it is possible to make current outputs of the MOS differential amplifier circuit linear. FIG. 14 shows a MOS differential amplifier circuit which does not require using the unity gain amplifier.

In the MOS differential amplifier circuit of FIG. 14, the common source voltage $V_{S1}$ of a MOS differential pair composed of P-channel transistors which are driven by a constant current source $2I_0$ is represented as follows:

$$V_B = V_{CM1} + |V_{THP}| + \sqrt{\frac{4I_0}{\beta_P} - V_i^2} \quad \left(|V_i| \leq \sqrt{\frac{2I_0}{\beta_P}}\right) \qquad (81)$$

P-channel transistors M7 and M8 and constant current sources $I_0$ constitute source follower transistors, and function to level-shift input voltages by a voltage $V_F$. Here, $V_F$ is represented as follows:

$$V_F = \sqrt{\frac{I_0}{\beta_P}} + |V_{THP}| \quad (82)$$

In a quadri-tail cell comprising N channel transistors M3, M4, M5 and M6 which are driven by a constant current source $4I_0$, the input voltages $V_1$ and $V_2$ are level-shifted by the voltage $V_F$ and are applied to the gate electrodes of the transistors M3 and M4, respectively. The common source voltage $V_{S1}$ of the transistors M1 and M2 is directly applied to the commonly coupled gates of the transistors M5 and M6. Therefore, the following formulas are obtained.

$$I_{D3} = \beta_N (V_1 + V_F - V_{S2} - V_{THN})^2 \quad (83)$$

$$I_{D4} = \beta_N (V_2 + V_F - V_{S2} - V_{THN})^2 \quad (84)$$

$$I_{D5} = I_{D6} = \beta_N (V_{S1} - V_{S2} - V_{THN})^2 \quad (85)$$

where, $I_{D3}$, $I_{D4}$, $I_{D5}$, $I_{D6}$ and $I_0$ satisfy the following relation:

$$I_{D3} + I_{D4} + I_{D5} + I_{D6} = 4I_0 \quad (86)$$

Therefore, the differential output current $\Delta I$ becomes as follows:

$$\Delta I = (I_{D3} + I_{D5}) - (I_{D4} + I_{D6}) = I_{D3} - I_{D4} = 2\beta_N V_i (V_{CM1} + V_F - V_{S2} - V_{THN}) \quad (87)$$

Here, by substituting the formulas (83)–(85) for the formula (86), it is possible to obtain ($V_{CM1} + V_F - V_{S2} - V_{THN}$) as follows:

$$V_{CM1} + V_F - V_{S2} - V_{THN} = \quad (88)$$

$$\frac{2\sqrt{\frac{I_0}{\beta_P}} - \sqrt{\frac{4I_0}{\beta_P} - V_i^2} + \sqrt{\frac{16 I_0}{\beta_N} - \frac{4I_0}{\beta_P} - V_i^2} + \sqrt{\frac{I_0}{\beta_P}} \sqrt{\frac{4I_0}{\beta_P} - V_i^2}}{4}$$

Assuming $\beta_N = \beta_P$, the formula (88) becomes as follows:

$$V_{CM1} + V_F - V_{S2} - V_{THN} = \sqrt{\frac{I_0}{\beta_P}} \quad (89)$$

Therefore, in such case, the formula (87) becomes as shown below, and it can be seen that the MOS differential amplifier circuit of FIG. 14 operates linearly.

$$\Delta I = 2\beta_N V_i \sqrt{\frac{I_0}{\beta_P}} \quad (90)$$

$$= 2\sqrt{B_N I_0} V_i$$

Also, from the formula (90), it can be seen that transconductance of the MOS differential amplifier circuit is determined depending on the drive current $I_0$. Therefore, by changing current values of constant current sources $I_0$, $2I_0$, $4I_0$ simultaneously, it is possible to set the transconductance to a desired value.

Since the circuit of FIG. 14 operates in A-class, output currents $I^+$ and $I^-$ are represented as follows:

$$I^+ = I_{D3} + I_{D5} = 2I_0 + \sqrt{B_N I_0} V_i \quad (91)$$

$$I^- = I_{D3} + I_{D5} = 2I_0 - \sqrt{B_N I_0} V_i \quad (92)$$

Therefore, voltage outputs are obtained via load resistors $R_L$ through which the output currents shown above flow.

Figure 15:
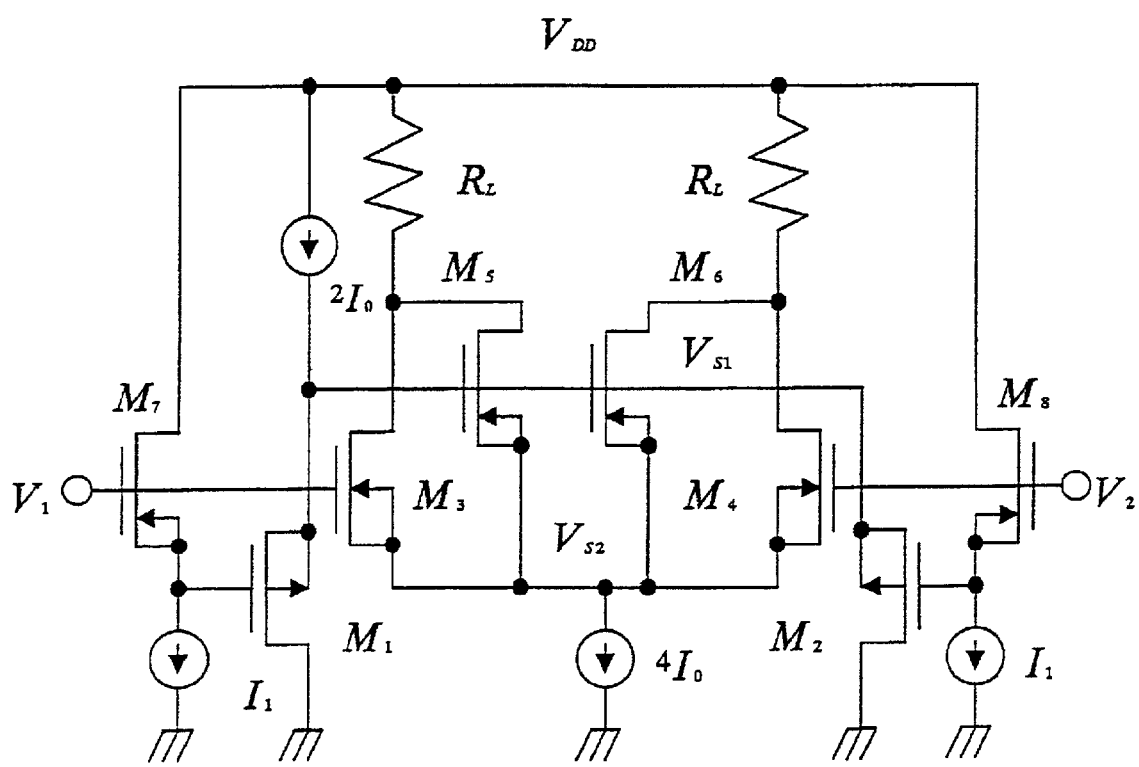
FIG. 15 is a circuit diagram showing a structure of a MOS differential amplifier circuit according to still another embodiment of the present invention.

As shown in FIG. 15, it is also possible to use source follower transistors M7 and M8 having different conductivity type than that of the source follower transistors used in the circuit of FIG. 14. In this case, when the threshold voltage $V_{THN}$ of the N-channel transistor and the threshold voltage $V_{THP}$ of the P-channel transistor differ from each other, it is necessary to set a current value $I_1$ of a constant current source such that the value of voltage shift by the source follower transistors M7 and M8 becomes equal to the value of voltage shift in the circuit of FIG. 14. Also, with respect to an effective mobility ($\mu_N$) of an N-channel transistor and an effective mobility ($\mu_P$) of a P-channel transistor, there is a relation $\mu_N > \mu_P$, and usually both differ from each other by approximately three times. Therefore, in order to match DC transfer characteristics of both transistors with each other, a gate ratio (W/L) of the P-channel transistor is made larger than that of the N-channel transistor depending on how smaller the effective mobility ($\mu_P$) of the P-channel transistor is when compared with that of the N-channel transistor. Alternatively, it is possible to enlarge the tail current to match DC transfer characteristics of both transistors with each other. Therefore, in general, frequency characteristics of the MOS differential amplifier circuit are limited depending on frequency characteristics of such P-channel transistors.

Figure 16:
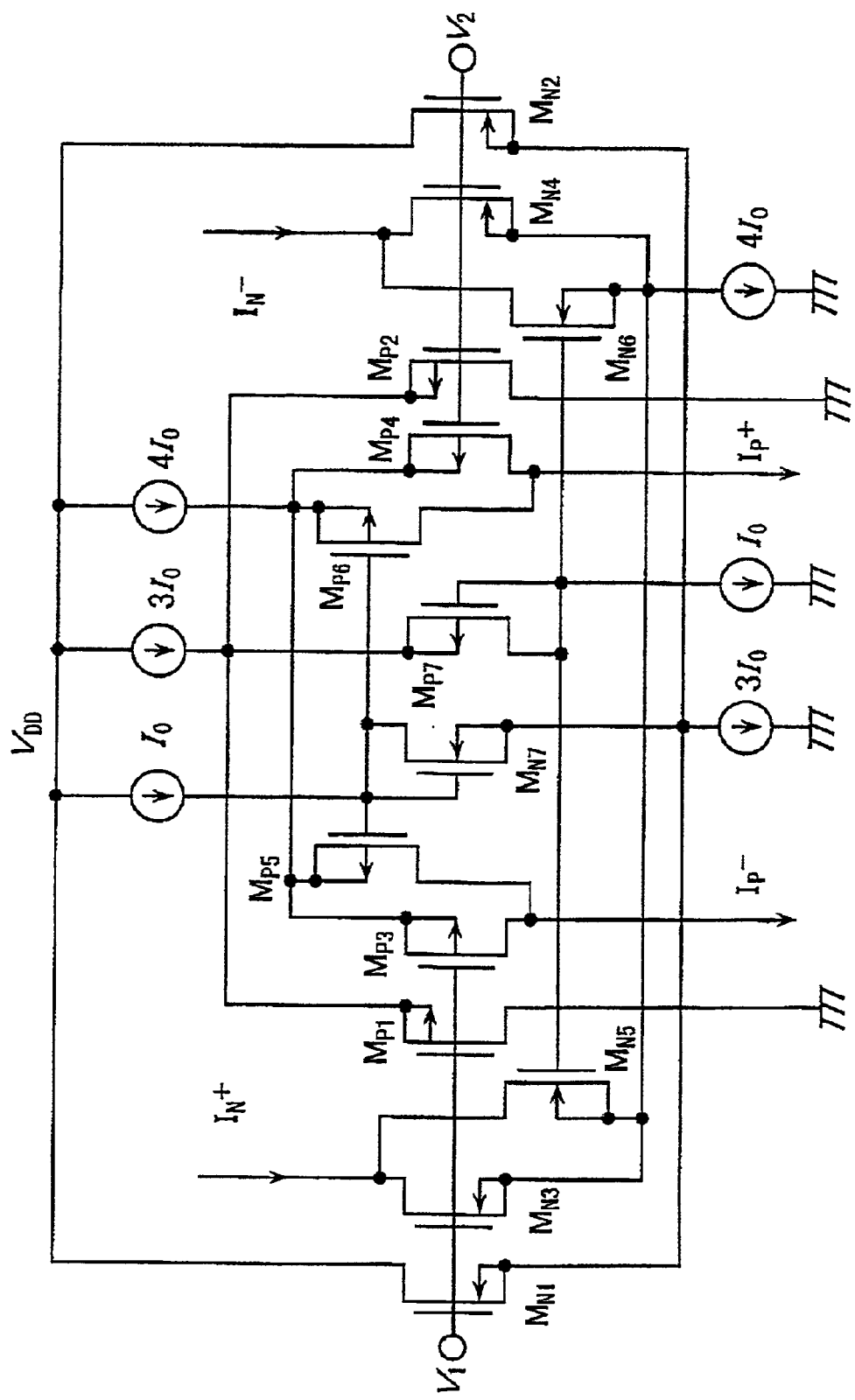
FIG. 16 is a circuit diagram showing a structure of a MOS differential amplifier circuit according to still another embodiment of the present invention.
Figure 17:
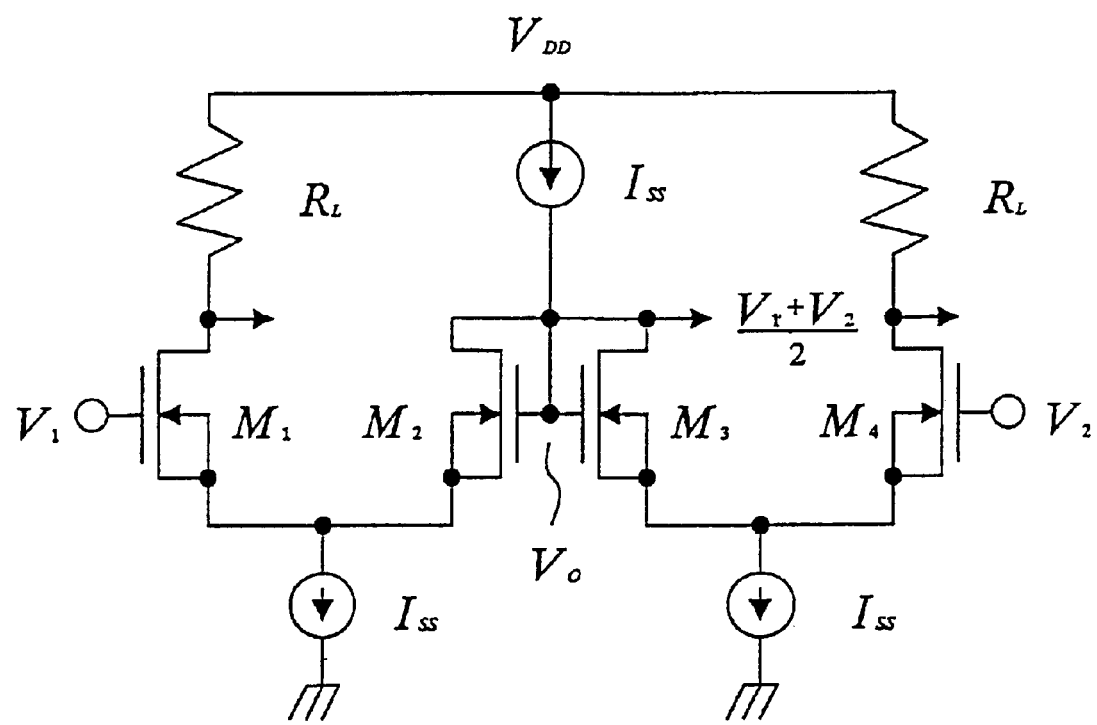
FIG. 17 is a circuit diagram showing a structure of a conventional voltage subtractor/adder circuit.
Figure 18:
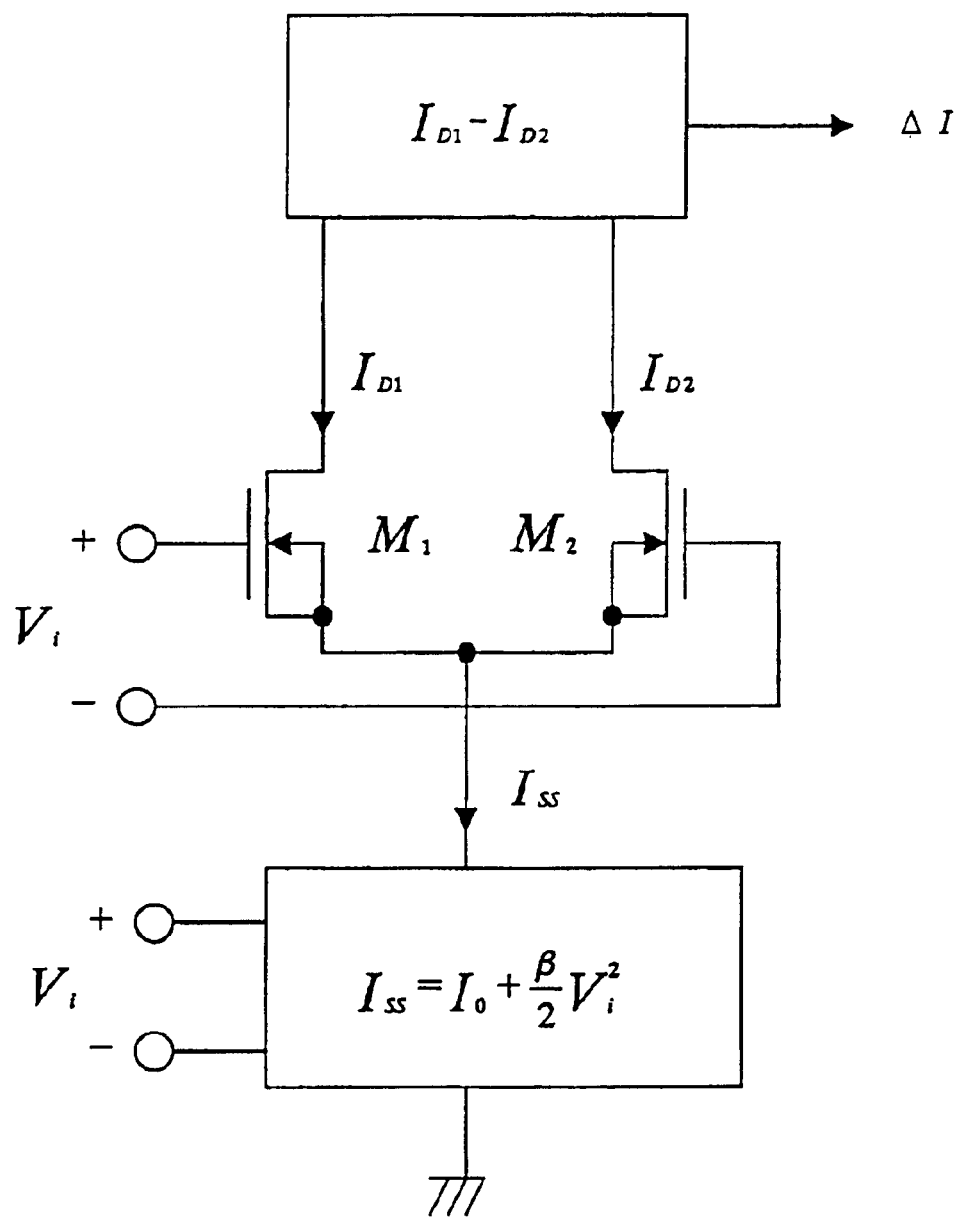
FIG. 18 is a circuit diagram showing a general structure of an adaptive-biasing differential pair.
Figure 19:
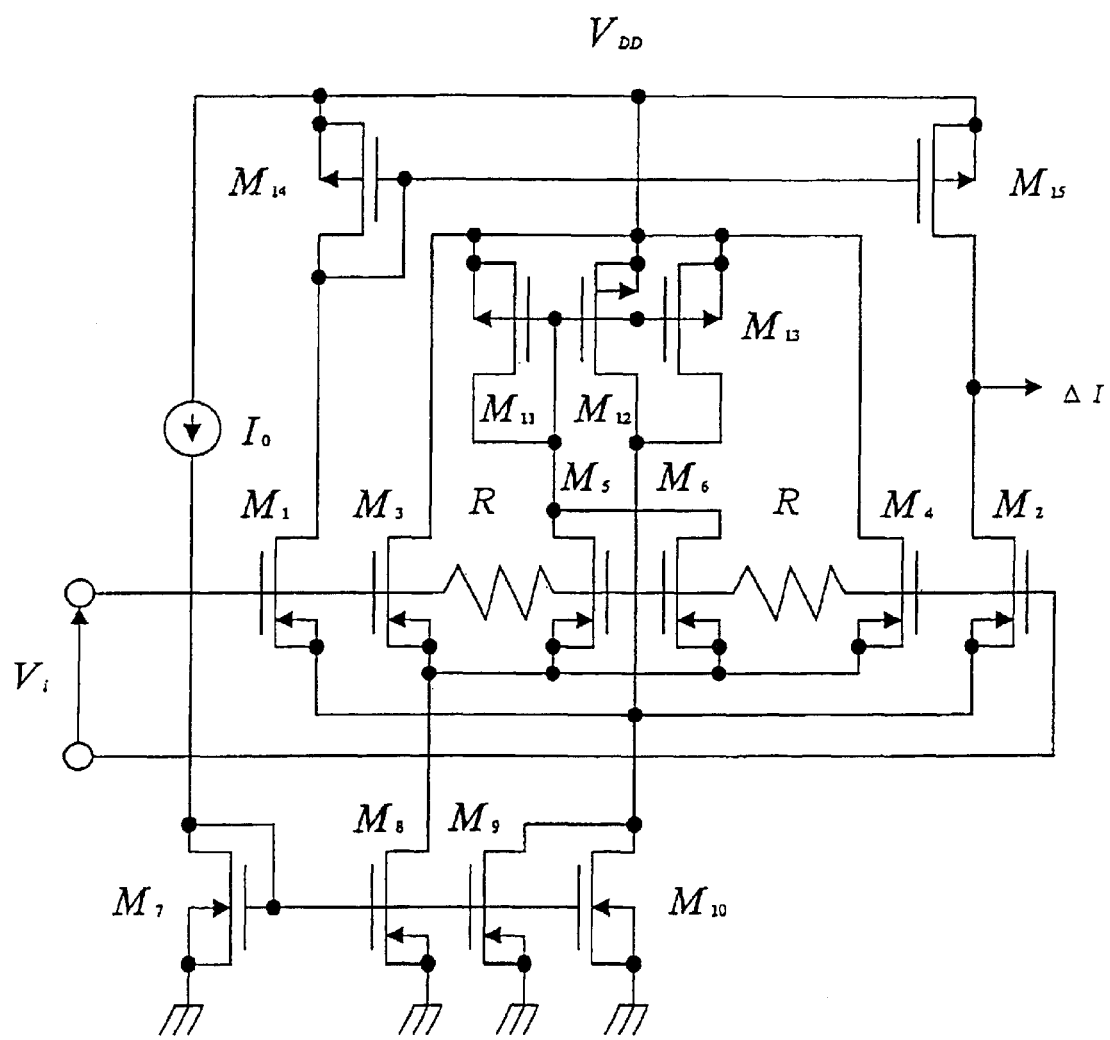
FIG. 19 is a circuit diagram showing a conventional MOS differential amplifier circuit comprising a MOS differential pair and a quadri-tail cell.

FIG. 16 shows a circuit which uses two MOS differential amplifier circuits using transistors having different conductivity types.

In the circuit of FIG. 16, level shift circuits are constituted of transistors $M_{N7}$ and $M_{P7}$ which share respective common source voltages and which are driven by constant current sources. Similarly to the circuit shown above, transconductance of the MOS differential amplifier circuit is determined depending on the drive current $I_0$. Therefore, by changing current values of constant current sources $I_0$, $3I_0$, $4I_0$ simultaneously, it is possible to set the transconductance to a desired value.

Also, by doubling the size of each of the transistors $M_{N7}$ and $M_{P7}$, both the drive current of the transistors $M_{N1}$, $M_{N2}$ and $M_{N7}$ and the drive current of the transistors $M_{P1}$, $M_{P2}$ and $M_{P7}$ vary from $3I_0$ to $4I_0$, and both the drive current of the transistor $M_{N7}$ and the drive current of the transistor $M_{P7}$ vary from $I_0$ to $2I_0$. The circuit of FIG. 16 has output terminals both on the side of a power supply voltage and on the side of the ground. Therefore, the circuit of FIG. 16 is preferable for use in an application in which an AB-class output circuit is to be driven by the circuit.

The present invention provides various advantageous effects.

First, according to the present invention, it is possible to realize a MOS differential amplifier circuit which has both linear voltage subtraction outputs and linear voltage addition outputs. Thereby, it is possible to realize a linear voltage subtractor/adder circuit. The reason why such circuit is realized is as follows. That is, the tail current of a MOS source-coupled differential pair is driven by using an output current of a squaring circuit which provides an output current proportional to an input voltage. Thereby, it is possible to make the common source voltage constant with respect to an input common mode voltage, and to make differential output current linear.

Second, according to the present invention, it is also possible to realize a linear voltage subtractor/adder circuit having a simplified structure and a small circuit scale if linearity requirement is not very strict.

Third, according to the present invention, it is possible to completely linearize the outputs of a MOS source-coupled differential pair. Thereby, it becomes possible to realize an ideal linear transconductance amplifier. This is because, by controlling the tail current such that the common source voltage of the MOS differential pair becomes constant with respect to the input common mode voltage, it becomes possible to realize a completely linear operation.

Fourth, according to the present invention, it is possible to expand an input voltage range within which linear transconductance is obtained. This is because, in the present invention, a tail current driving a MOS differential pair is made variable.

Fifth, according to the present invention, it is possible to completely linearize output voltages of a MOS differential pair. Thereby, it becomes possible to realize an ideal linear transconductance amplifier. The reason for this is as follows. The output currents of a MOS source-coupled differential pair are compressed to their square-roots, and outputted as a differential output. In such case, the following identity is obtained.

$$\sqrt{a+\sqrt{2x}\sqrt{1-\frac{x^2}{2}}} - \sqrt{a-\sqrt{2x}\sqrt{1-\frac{x^2}{2}}} = \sqrt{2x} \tag{93}$$

This formula shows that such differential output behaves linearly. Therefore, MOS transistors are used as loads of a MOS differential pair to provide output voltages. Also, a voltage is obtained by subtracting the common source voltage of a MOS differential pair from the input common mode voltage, and this voltage is applied to the commonly coupled gates of the MOS load transistors. Thereby, it becomes possible to realize an A-class operation, and to obtain a completely linear output voltage.

Sixth, according to the present invention, it is possible to independently adjust the transconductance of a MOS differential amplifier circuit having linear transconductance. Thereby, it becomes possible to realize a MOS differential amplifier circuit in which transconductance is tunable. This is because, in a MOS differential amplifier circuit, constant current sources are required for driving a MOS differential pair and a MOS quadri-tail cell which constitute the MOS differential amplifier circuit. By controlling the current values of the constant current sources, it becomes possible to adjust or change the transconductance.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A voltage subtractor/adder circuit comprising:

a current subtractor and a current-to-voltage converting means providing an output terminal for outputting an output voltage in proportion to the subtraction of two input voltages; and a differential pair having first and second MOS transistors, both gate electrodes of said first and second MOS transistors forming input terminals for receiving each voltage of said two input voltages, respectively, drain electrodes of said first and second MOS transistors supplying a differential current to said current subtractor, and source electrodes of said first and second MOS transistors being commonly coupled to form an output terminal for outputting an addition output voltage in proportion to half of the addition of two input voltages;

wherein the sums of currents flowing through said first and second MOS transistors increases in proportion to the square of a difference of said two input voltages; and a level shifter for level-shifting said addition output voltage from said source electrodes which are commonly coupled.

2. A voltage subtractor/adder circuit comprising:

a current subtractor and a current-to-voltage converting means providing an output terminal for outputting an output voltage in proportion to the subtraction of an input differential voltage;

a differential pair having first and second MOS transistors, gate electrodes of said first and second MOS transistors forming input terminals for receiving said input differential voltage, drain electrodes of said first and second MOS transistors forming output terminals for outputting signals to be subtracted to said current subtractor, and source electrodes of said first and second MOS transistors being commonly coupled to form an output terminal for outputting a voltage to be added;

a constant current source which drives said differential pair; and a level shifter for level-shifting the addition output voltage from said source electrodes which are commonly coupled.

* * * * *